US010109980B2

(12) United States Patent
Koda et al.

(10) Patent No.: US 10,109,980 B2
(45) Date of Patent: Oct. 23, 2018

(54) OPTICAL SEMICONDUCTOR ELEMENT AND LASER DEVICE ASSEMBLY

(71) Applicant: SONY CORPORATION, Tokyo (JP)

(72) Inventors: Rintaro Koda, Tokyo (JP); Masaru Kuramoto, Kanagawa (JP); Shunsuke Kono, Kanagawa (JP); Hideki Watanabe, Kanagawa (JP); Hiroshi Yoshida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/519,443

(22) PCT Filed: Aug. 20, 2015

(86) PCT No.: PCT/JP2015/073305
§ 371 (c)(1),
(2) Date: Apr. 14, 2017

(87) PCT Pub. No.: WO2016/063605
PCT Pub. Date: Apr. 28, 2016

(65) Prior Publication Data
US 2017/0250522 A1    Aug. 31, 2017

(30) Foreign Application Priority Data
Oct. 23, 2014   (JP) .................................. 2014-216202

(51) Int. Cl.
*H01S 5/00*    (2006.01)
*H01S 5/10*    (2006.01)
(Continued)

(52) U.S. Cl.
CPC ............ *H01S 5/1014* (2013.01); *H01S 5/026* (2013.01); *H01S 5/0425* (2013.01);
(Continued)

(58) Field of Classification Search
CPC ...... H01S 5/1014; H01S 5/026; H01S 5/0425; H01S 5/22; H01S 5/34333; H01S 5/2045;
(Continued)

(56) References Cited

U.S. PATENT DOCUMENTS 5,539,571 A * 7/1996 Welch ..................... H01S 5/026
                                                    359/344
5,793,521 A * 8/1998 O'Brien .................. H01S 5/026
                                                    359/344
(Continued)

FOREIGN PATENT DOCUMENTS

JP    64-061084 A    3/1989
JP    64-076784 A    3/1989
(Continued)

OTHER PUBLICATIONS

Hou, et al., "Narrow Linewidth Laterally Coupled 1.55 μm AlGaInAs/InP Distributed Feedback Lasers Integrated with a Curved Tapered Semiconductor Optical Amplifier", Optics Letters, vol. 37, No. 21, Nov. 1, 2012, pp. 4525-4527.
(Continued)

*Primary Examiner* — Kinam Park
(74) *Attorney, Agent, or Firm* — Chip Law Group

(57) ABSTRACT

Provided is an optical semiconductor element including: a stacked structure body 20 formed of a first compound semiconductor layer 21, a third compound semiconductor layer (active layer) 23, and a second compound semiconductor layer 22. A fundamental mode waveguide region 40 with a waveguide width $W_1$, a free propagation region 50 with a width larger than $W_1$, and a light emitting region 60 having a tapered shape (flared shape) with a width increasing toward a light emitting end surface 25 are arranged in sequence.

17 Claims, 12 Drawing Sheets

(51) Int. Cl.
*H01S 5/026* (2006.01)
*H01S 5/042* (2006.01)
*H01S 5/22* (2006.01)
*H01S 5/343* (2006.01)
*H01S 5/50* (2006.01)
*H01S 5/062* (2006.01)
*H01S 5/323* (2006.01)
*H01S 5/20* (2006.01)
*H01S 5/0625* (2006.01)

(52) U.S. Cl.
CPC ........ *H01S 5/06216* (2013.01); *H01S 5/2045* (2013.01); *H01S 5/22* (2013.01); *H01S 5/32341* (2013.01); *H01S 5/34333* (2013.01); *H01S 5/5081* (2013.01); *H01S 5/06253* (2013.01)

(58) Field of Classification Search
CPC ............... H01S 5/32341; H01S 5/5081; H01S 5/06216; H01S 5/06253
See application file for complete search history.

(56) References Cited

U.S. PATENT DOCUMENTS

| | | | | |
|---|---|---|---|---|
| 5,914,978 | A * | 6/1999 | Welch | ............... H01S 5/026 372/102 |
| 2011/0051766 | A1* | 3/2011 | Reill | ............... H01S 5/22 372/45.01 |
| 2012/0099185 | A1* | 4/2012 | Yokoyama | ............ B82Y 20/00 359/340 |
| 2013/0336349 | A1* | 12/2013 | Watanabe | ............. H01S 5/1014 372/45.013 |
| 2014/0285876 | A1* | 9/2014 | Yoshida | ................ H01S 5/1064 359/341.3 |

FOREIGN PATENT DOCUMENTS

| | | |
|---|---|---|
| JP | 05-067845 A | 3/1993 |
| JP | 2002-031730 A | 1/2002 |
| JP | 2005-183821 A | 7/2005 |
| JP | 2007-243072 A | 9/2007 |
| JP | 2011-507288 A | 3/2011 |
| JP | 2012-094622 A | 5/2012 |
| JP | 2012-151210 A | 8/2012 |
| JP | 2014-187299 A | 10/2014 |

OTHER PUBLICATIONS

Hou, et al., "Narrow Linewidth Laterally Coupled 1.55 μm AlGaInAs/InP Distributed Feedback Lasers Integrated with a Curved Tapered Semiconductor Optical Amplifier", Optical Society of America, Optics Letters, vol. 37, No. 21, Nov. 1, 2012, pp. 4525-4527.

* cited by examiner

FIRST ELECTRODE

US 10,109,980 B2

OPTICAL SEMICONDUCTOR ELEMENT AND LASER DEVICE ASSEMBLY

CROSS REFERENCE TO RELATED APPLICATIONS

This application is a U.S. National Phase of International Patent Application No. PCT/JP2015/073305 filed on Aug. 20, 2015, which claims priority benefit of Japanese Patent Application No. JP 2014-216202 filed in the Japan Patent Office on Oct. 23, 2014. Each of the above-referenced applications is hereby incorporated herein by reference in its entirety.

TECHNICAL FIELD

The present disclosure relates to an optical semiconductor element and a laser device assembly.

BACKGROUND ART

Technologies related to ultrashort pulse lasers began to move forward in the latter half of 1960, and have progressed rapidly to be studied actively in recent years. As a light source thereof, an expensive, large, high-precision solid state laser device, typified by a titanium-sapphire laser, is mainly used, and this point is a factor that inhibits widespread use of the technology. If an ultrashort pulse laser can be implemented by a semiconductor laser element, significant size reduction, cost reduction, and high stabilization are expected to be achieved, making a breakthrough in spreading the use of advanced science and technology in this field. For example, if an ultrashort pulse laser whose wavelength region is the 405 nm band can be implemented by only a semiconductor laser element, it can be used as a volumetric optical disk light source in the next generation to Blu-ray (registered trademark), and moreover, a handy ultrashort pulse light source covering the entire wavelength band in the visible light region can be obtained. This makes it possible to provide a light source that is required in a wide variety of fields, including medical fields, bioimaging fields, and optical shaping fields, which presumably contributes greatly to the progress of science and technology.

In addition, an increase in output power is a big problem for a laser light source. Therefore, as well as an increase in output power of a semiconductor laser element, a semiconductor optical amplifier (SOA) has been under study, as a means for amplifying light from a laser light source. Conventionally, optical amplifiers have been developed mainly for optical communication, and therefore practical utilization of a semiconductor optical amplifier in the 405 nm band has hardly been seen. A semiconductor optical amplifier for the 1.5 µm band using a GaInAsP-based compound semiconductor and having a tapered ridge stripe structure is known from JP H5-067845A, for example. The technology disclosed in JP H5-067845A expands a mode field in accordance with an optical waveguide width by gradually increasing the optical waveguide width in a tapered shape from a narrow input-side optical waveguide satisfying a single-mode condition to an output-side optical waveguide in a semiconductor optical amplifier, thus expanding the maximum output of the semiconductor optical amplifier.

In addition, a semiconductor laser element (specifically, a mode-locked semiconductor laser element) that is formed of a stacked structure body of a first compound semiconductor layer, a third compound semiconductor layer, and a second compound semiconductor layer and has a ridge stripe structure is known from JP 2012-151210A. In the semiconductor laser element, the stacked structure body forms three regions (a first light emitting region, a saturable absorption region, and a second light emitting region), and the second light emitting region positioned at the light emitting end surface side has a tapered shape with a width increasing toward the light emitting end surface.

CITATION LIST

Patent Literature

Patent Literature 1: JP H5-067845A
Patent Literature 2: JP 2012-151210A

DISCLOSURE OF INVENTION

Technical Problem

As disclosed in JP H5-067845A, expansion of the maximum output of the semiconductor optical amplifier can be achieved by increasing the optical waveguide width in a tapered shape toward the light emitting end surface side, but laser light emitted from the semiconductor optical amplifier does not have high beam quality. Moreover, the technology disclosed in JP 2012-151210A aims to prevent occurrence of damage in the saturable absorption region etc., and is not intended for an increase in output power and an improvement in beam quality of laser light.

Accordingly, an object of the present disclosure is to provide an optical semiconductor element having a configuration and structure that enable an improvement in beam quality of emitted light and an increase in output power to be achieved at the same time, and a laser device assembly in which the optical semiconductor element is incorporated.

Solution to Problem

According to the present disclosure in order to achieve the above object, there is provided an optical semiconductor element including: a stacked structure body formed of a first compound semiconductor layer, a third compound semiconductor layer (active layer), and a second compound semiconductor layer. A fundamental mode waveguide region with a waveguide width $W_1$, a free propagation region with a width larger than $W_1$, and a light emitting region having a tapered shape (flared shape) with a width increasing toward a light emitting end surface are arranged in sequence.

According to the present disclosure in order to achieve the above object, there is provided a laser device assembly including: a laser light source; and a semiconductor optical amplifier (SOA) that is formed of the above optical semiconductor element of the present disclosure and configured to amplify laser light emitted from the laser light source. An axis of the light emitting region and the light emitting end surface in the optical semiconductor element forming the semiconductor optical amplifier cross each other at an acute angle.

Advantageous Effects of Invention

In the optical semiconductor element of the present disclosure, or an optical semiconductor element that forms the semiconductor optical amplifier in the laser device assembly of the present disclosure (hereinafter, these optical semiconductor elements will be collectively called an "optical semiconductor element etc. of the present disclosure"), the light emitting region has a tapered shape with a width increasing toward the light emitting end surface; thus, a mode field can be expanded in the light emitting region, and an increase in optical output of the optical semiconductor element can be achieved. In addition, in the case where the semiconductor optical amplifier is formed of an optical semiconductor element, light can be amplified with a single transverse mode maintained. Moreover, since the free propagation region with a width larger than the waveguide width $W_1$ of the fundamental mode waveguide region is provided, an improvement in beam quality of emitted light can be achieved. Note that the effects described in the present specification are only examples and not limitative, and there may be an additional effect.

MODE(S) FOR CARRYING OUT THE INVENTION

Figure 1A:
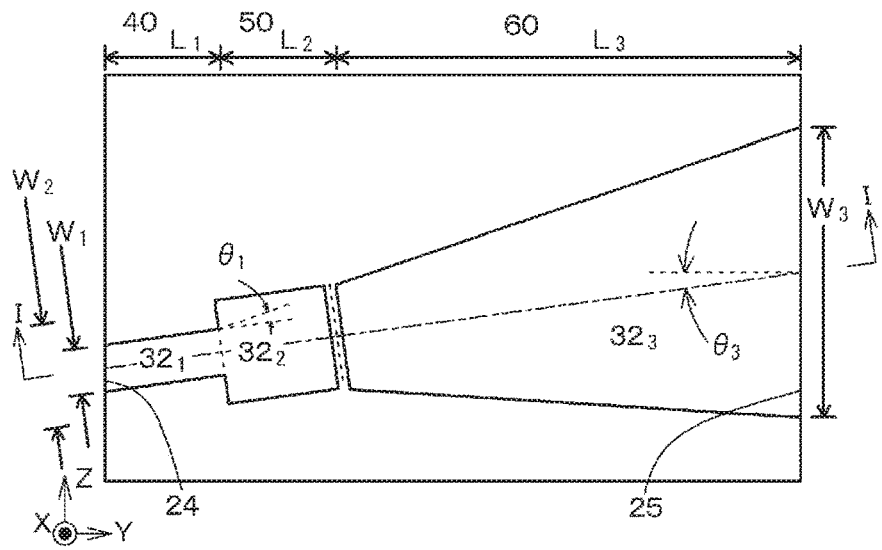
FIG. 1A is a schematic plan view of an optical semiconductor element of Example 1 (semiconductor optical amplifier)

Hereinbelow, the present disclosure is described based on Examples with reference to the drawings, but the present disclosure is not limited to Examples and the various numerical values and materials in Examples are only examples. The description is given in the following order.

1. Overall description of optical semiconductor element and laser device assembly of the present disclosure
2. Example 1 (optical semiconductor element of the present disclosure and laser device assembly of the present disclosure)
3. Example 2 (modification of Example 1; semiconductor optical amplifier)
4. Example 3 (another modification of Example 1)
5. Example 4 (still another modification of Example 1)
6. Example 5 (still another modification of Example 1; mode-locked semiconductor laser element)
7. Others <Overall Description of Optical Semiconductor Element and Laser Device Assembly of the Present Disclosure>

In a laser device assembly of the present disclosure, a configuration is possible in which the width of a portion of a fundamental mode waveguide region where laser light from a laser light source enters is equal to the width of the laser light that enters. Here, "equal" means $0.8 \leq$ (the width $W_{10}$ of a portion of the fundamental mode waveguide region where laser light from a semiconductor laser element enters)/(the width $W_{Laser}$ of the laser light that enters)$\leq 1.2$. A configuration in which the laser light source is formed of a semiconductor laser element is possible.

In the optical semiconductor element etc. of the present disclosure including the preferred configurations described above, a configuration is possible in which, when the length of a free propagation region is denoted by $L_2$, the diffraction angle of light that proceeds from the fundamental mode waveguide region toward the free propagation region is denoted by $\theta_1$, and the width of a boundary portion between a light emitting region and the free propagation region is denoted by $W_2$, $$W_2 > 2L_2 \cdot \tan(\theta_1) + W_1$$

is satisfied. Here, when the average refractive index of a first region of a stacked structure body that forms the fundamental mode waveguide region is denoted by $n_{1-ave}$ and the main wavelength (peak wavelength) of light guided through the fundamental mode waveguide region is denoted by $\lambda_0$, the diffraction angle $\theta_1$ can be expressed, as divergence of a Gaussian beam due to Fraunhofer diffraction, by a formula as follows.

$$\vartheta_1 = \tan^{-1}\left(\frac{\lambda_0 / n_{1-ave}}{\pi \cdot W_1}\right)$$

In the optical semiconductor element etc. of the present disclosure including the various preferred configurations described above, the value of $M^2$ of light emitted from the light emitting region is preferably 3 or less. Here, $M^2$ (also called beam propagation factor) is an index indicating how close the light emitted from the light emitting region is to single mode $TEM_{00}$, and its ideal value (a value for a complete Gaussian beam) is "1.0". $M^2$ is set in ISO 11146-1, for example.

Furthermore, in the optical semiconductor element etc. of the present disclosure including the various preferred configurations described above, a configuration is possible in which a first portion of a second electrode is formed on a second compound semiconductor layer in the first region of the stacked structure body that forms the fundamental mode waveguide region, a second portion of the second electrode is formed on the second compound semiconductor layer in a second region of the stacked structure body that forms the free propagation region, a third portion of the second electrode is formed on the second compound semiconductor layer in a third region of the stacked structure body that forms the light emitting region, and a first electrode electrically connected to a first compound semiconductor layer that forms the stacked structure body is provided.

In this configuration, a configuration is possible in which the first portion of the second electrode is continuous with the second portion of the second electrode, the second portion of the second electrode is separated from the third portion of the second electrode, a DC voltage (a forward bias) is applied between the first portion of the second electrode and the second portion of the second electrode, and the first electrode, and a pulsed voltage (a forward bias) is applied between the third portion of the second electrode and the first electrode, and furthermore, a configuration is possible in which a current of $3 \times 10^3$ amperes or more per 1 cm$^2$ of the third portion of the second electrode is sent to the third portion of the second electrode.

Alternatively, in this configuration, a configuration is possible in which the first portion of the second electrode, the second portion of the second electrode, and the third portion of the second electrode are continuous with each other, and a DC voltage (a forward bias) is applied between the first portion of the second electrode, the second portion of the second electrode, and the third portion of the second electrode, and the first electrode.

Furthermore, in the optical semiconductor element etc. of the present disclosure including the various preferred forms and configurations described above, a configuration is possible in which the first region of the stacked structure body that forms the fundamental mode waveguide region, the second region of the stacked structure body that forms the free propagation region, and the third region of the stacked structure body that forms the light emitting region have a ridge stripe structure, that is, a separate confinement heterostructure (SCH structure) of a ridge stripe type. Alternatively, a configuration is possible in which only the first region of the stacked structure body that forms the fundamental mode waveguide region has a ridge stripe structure. In the latter case, in the second region of the stacked structure body that forms the free propagation region and the third region of the stacked structure body that forms the light emitting region, each region can be partitioned on the basis of a gain-guiding scheme or an index-guiding scheme.

Furthermore, in the optical semiconductor element etc. of the present disclosure including the various preferred forms and configurations described above, a configuration is possible in which a current non-injection region is provided near a light emitting end surface, which configuration can prevent occurrence of damage at the light emitting end surface. Note that a configuration is also possible in which a current non-injection region is provided near an end surface facing the light emitting end surface, and a configuration is also possible in which a current non-injection region is provided near the light emitting end surface and near the end surface facing the light emitting end surface.

Furthermore, in the optical semiconductor element etc. of the present disclosure including the various preferred forms and configurations described above, a configuration in which the stacked structure body is made of a GaN-based compound semiconductor is possible.

Furthermore, in the optical semiconductor element etc. of the present disclosure including the various preferred forms and configurations described above, when the average width of the free propagation region is denoted by $W_{2\text{-}ave}$ and the width of a portion of the light emitting region that faces the light emitting end surface is denoted by $W_3$, $0.5 \text{ μm} \leq W_1 \leq 2.5 \text{ μm}$ $1.2 \leq W_{2\text{-}ave}/W_1 \leq 500$ $20 \text{ μm} \leq W_3 \leq 650 \text{ μm}$ are preferably satisfied.

Furthermore, in the optical semiconductor element etc. of the present disclosure including the various preferred forms and configurations described above, a configuration is possible in which the axis of the light emitting region and the light emitting end surface cross each other at an acute angle. Furthermore, in the optical semiconductor element etc. of the present disclosure including the various preferred forms and configurations described above, including this configuration, a configuration in which the optical semiconductor element is formed of a semiconductor optical amplifier (SOA) is possible, and a configuration in which the optical semiconductor element is formed of a semiconductor laser element (LD) is possible. In the latter case, a mode-locked semiconductor laser element can be given as an example of the semiconductor laser element. It is preferable that the semiconductor optical amplifier perform two-fold or more amplification on light intensity of a light beam that enters, and emit the amplified light beam.

The fundamental mode waveguide region can be defined as a waveguide region that propagates only a fundamental mode, and the free propagation region can be defined as a region that propagates light freely in a state without light confinement with respect to the transverse direction. The waveguide width $W_1$ of the fundamental mode waveguide region is preferably constant. The free propagation region also preferably has a constant width ($W_2$), but may have a tapered shape (flared shape) with a width increasing toward the light emitting region side, depending on the circumstances. The light emitting region has a tapered shape (flared shape) with a width increasing toward the light emitting end surface; a boundary line of the light emitting region along the axis of the light emitting region may be straight-lined or may be curved. In the description below, the length direction of the stacked structure body is called X direction, the width direction of the stacked structure body is called Y direction, and the thickness direction of the stacked structure body is called Z direction. In addition, the light emitting end surface is called "second end surface" and an end surface of the optical semiconductor element that faces the second end surface is called "first end surface" in some cases.

In the optical semiconductor element etc. of the present disclosure, the first compound semiconductor layer, the third compound semiconductor layer (active layer), and the second compound semiconductor layer are made of, for example, a GaN-based compound semiconductor, as described above. Specifically, a configuration in which the stacked structure body is made of an AlInGaN-based compound semiconductor is possible. Here, as the AlInGaN-based compound semiconductor, more specifically, GaN, AlGaN, InGaN, and AlInGaN may be given. A boron (B) atom, a thallium (Tl) atom, an arsenic (As) atom, a phosphorus (P) atom, or an antimony (Sb) atom may be contained in these compound semiconductors, as desired. The third compound semiconductor layer (active layer), which forms the light emitting region, a gain region (including a saturable absorption region described later), and so on, has, for example, a quantum well structure. Specifically, the third compound semiconductor layer may have a single quantum well structure (SQW structure), or may have a multi quantum well structure (MQW structure). The third compound semiconductor layer (active layer) having a quantum well structure has a structure in which at least one well layer and one barrier layer are stacked; and as the combination of (compound semiconductor that forms the well layer, compound semiconductor that forms the barrier layer), ($In_y Ga_{(1-y)}N$, GaN), ($In_y Ga_{(1-y)}N$, $In_z Ga_{(1-z)}N$) [provided that y>z], and ($In_y Ga_{(1-y)}N$, AlGaN) may be illustrated. The thickness of the well layer is not less than 1 nm and not more than 10 nm, preferably not less than 1 nm and not more than 8 nm. The impurity doping concentration of the barrier layer is preferably, but not limited to, not less than $2 \times 10^{18}$ cm$^{-3}$ and not more than $1 \times 10^{20}$ cm$^{-3}$, preferably not less than $1 \times 10^{19}$ cm$^{-3}$ and not more than $1 \times 10^{20}$ cm$^{-3}$.

In the second compound semiconductor layer, a non-doped compound semiconductor layer (e.g., a non-doped InGaN layer or a non-doped AlGaN layer) may be formed between the third compound semiconductor layer and an electron barrier layer. Furthermore, a non-doped InGaN layer as a light guide layer may be formed between the third compound semiconductor layer and the non-doped compound semiconductor layer. Also a structure in which a Mg-doped GaN layer (p-side contact layer) occupies the uppermost layer of the second compound semiconductor layer is possible. The electron barrier layer, the non-doped compound semiconductor layer, the light guide layer, and the p-side contact layer form the second compound semiconductor layer.

In the optical semiconductor element etc. of the present disclosure, in a configuration in which the axis of the light emitting region and the surface light emitting end surface (second end surface) cross each other at an acute angle (angle: 90−$\theta_3$ (degree)), 0.1 degrees≤$\theta_3$≤10 degrees may be illustrated. In the case where the light emitting region has a ridge stripe structure, the axis of the light emitting region is a straight line that connects the middle point between both ends of the ridge stripe structure at the second end surface and the middle point between both ends of the ridge stripe structure at the boundary portion between the light emitting region and the free propagation region (hereinafter called "second boundary portion" in some cases). In the case where only the fundamental mode waveguide region has a ridge stripe structure, the axis of the light emitting region is a straight line that connects the middle point of an end of the third portion of the second electrode at the second end surface side and the middle point of an end of the third portion of the second electrode at the free propagation region side. In the case where the free propagation region has a ridge stripe structure, the axis of the free propagation region is a straight line that connects the middle point between both ends of the ridge stripe structure at the second boundary portion and the middle point between both ends of the ridge stripe structure at the boundary portion between the free propagation region and the fundamental mode waveguide region (hereinafter called "first boundary portion" in some cases). In the case where only the fundamental mode waveguide region has a ridge stripe structure, the axis of the free propagation region is a straight line that connects the middle point of an end of the second portion of the second electrode at the light emitting region side and the middle point of an end of the second portion of the second electrode at the fundamental mode waveguide region side. The axis of the fundamental mode waveguide region is a straight line that connects the middle point between both ends of the ridge stripe structure at the first boundary portion and the middle point between both ends of the ridge stripe structure at the first end surface. The axis of the light emitting region and the axis of the free propagation region may be or may not be on the same straight line. The axis of the fundamental mode waveguide region and the axis of the free propagation region are on the same straight line.

In the laser device assembly of the present disclosure, in the case where the laser light source is formed of a semiconductor laser element, a mode-locked semiconductor laser element can be given as the semiconductor laser element. Note that the laser light source is not limited to this configuration, and a laser light source such as a known continuous-wave laser light source, a known pulsed laser light source in various schemes and forms including a gain-switching scheme and a loss-switching scheme (Q-switching scheme), and a titanium-sapphire laser can also be used.

A semiconductor optical amplifier directly amplifies an optical signal as light without converting it into an electric signal, has a laser structure from which a resonator effect is eliminated as much as possible, and amplifies incident light with the optical gain of the semiconductor optical amplifier. In the case where the semiconductor optical amplifier is formed of the optical semiconductor element of the present disclosure, a configuration is possible in which, not limitedly, light intensity density of laser light output from the semiconductor optical amplifier 60 kilowatts or more, preferably 600 kilowatts or more per 1 cm$^2$ of the third compound semiconductor layer (active layer) that forms the light emitting end surface (second end surface). A configuration is possible in which the semiconductor optical amplifier is formed of a transmissive semiconductor optical amplifier, but the configuration is not limited to this, and for example, a configuration is possible in which the semiconductor optical amplifier is formed of a monolithic semiconductor optical amplifier in which a semiconductor laser element and a semiconductor optical amplifier are integrated.

In the case where the semiconductor laser element is formed of the optical semiconductor element of the present disclosure, a configuration is possible in which the semiconductor laser element further includes an external mirror (external reflection mirror). That is, the semiconductor laser element can be of an external resonator type. Alternatively, the semiconductor laser element can be of a monolithic type. The external-resonator-type semiconductor laser element may be of a light condensing type or may be of a collimating type. In the external-resonator-type semiconductor laser element, the light reflectance of one end surface of the stacked structure body from which a light beam (light pulse) is emitted is preferably 0.5% or less. This value of light reflectance is markedly lower than the light reflectance of one end surface of a stacked structure body from which a light beam (light pulse) is emitted in a conventional semiconductor laser element (usually 5% to 10%). In the external-resonator-type semiconductor laser element, the value of an external resonator length (X', unit: mm) may be $$0 < X' < 1500,$$

preferably $$30 \leq X' \leq 300.$$

Here, the external resonator is formed by a light reflecting end surface of the semiconductor laser element and a reflection mirror, for example, which forms an external resonator structure, and the external resonator length is the distance between the light reflecting end surface of the semiconductor laser element and the reflection mirror. The configuration can also be applied to a superluminescent diode (SLD).

In the case where the semiconductor laser element is formed of the optical semiconductor element of the present disclosure, a configuration is possible in which a low-reflection coating layer is formed on at least the second end surface. In the case where the semiconductor optical amplifier is formed of the optical semiconductor element of the present disclosure, a configuration is possible in which a low-reflection coating layer is formed on the first end surface and the second end surface. Here, the low-reflection coating layer is formed of, for example, a stacked structure of at least two layers selected from the group consisting of a titanium oxide layer, a tantalum oxide layer, a zirconia oxide layer, a silicon oxide layer, and an aluminum oxide layer.

In the optical semiconductor element etc. of the present disclosure, the second electrode is formed on the second compound semiconductor layer. Here, a configuration in which the second electrode is, for example, formed of a palladium (Pd) single layer, a nickel (Ni) single layer, a platinum (Pt) single layer, a palladium layer/platinum layer stacked structure in which a palladium layer is in contact with the second compound semiconductor layer, or a palladium layer/nickel layer stacked structure in which a palladium layer is in contact with the second compound semiconductor layer is possible. In the case where the lower metal layer is formed of palladium and the upper metal layer is formed of nickel, the thickness of the upper metal layer may be 0.1 μm or more, preferably 0.2 μm or more. Alternatively, a configuration in which the second electrode is made of a palladium (Pd) single layer is preferable, and in this case the thickness may be 20 nm or more, preferably 50 nm or more. Alternatively, a configuration in which the second electrode is made of a palladium (Pd) single layer, a nickel (Ni) single layer, a platinum (Pt) single layer, or a stacked structure of a lower metal layer and an upper metal layer in which the lower metal layer is in contact with the second compound semiconductor layer (provided that the lower metal layer is formed of one metal selected from the group consisting of palladium, nickel, and platinum, and the upper metal layer is formed of a metal whose etching rate in forming an isolation trench between the second portion and the third portion of the second electrode is the same as or equivalent to the etching rate of the lower metal layer or higher than the etching rate of the lower metal layer) is preferable.

When the first conductivity type is the n-type, the first electrode electrically connected to the first compound semiconductor layer having the n-conductivity type preferably has a single-layer configuration or a multiple-layer configuration containing at least one metal selected from the group consisting of gold (Au), silver (Ag), palladium (Pd), aluminum (Al), titanium (Ti), tungsten (W), copper (Cu), zinc (Zn), tin (Sn), and indium (In); for example, Ti/Au, Ti/Al, and Ti/Pt/Au may be illustrated. The first electrode is electrically connected to the first compound semiconductor layer, and the connection form includes a configuration in which the first electrode is formed on the first compound semiconductor layer and a configuration in which the first electrode is connected to the first compound semiconductor layer via an electrically conductive material layer or an electrically conductive substrate or substratum. The first electrode and the second electrode can be formed into a film by, for example, various PVD methods such as the vacuum deposition method and the sputtering method.

A pad electrode may be provided on the first electrode and the second electrode in order to electrically connect the first electrode and the second electrode to an external electrode or circuit. The pad electrode preferably have a single-layer configuration or a multiple-layer configuration containing at least one metal selected from the group consisting of titanium (Ti), aluminum (Al), platinum (Pt), gold (Au), and nickel (Ni). Alternatively, the pad electrode may be a multiple-layer configuration such as a multiple-layer configuration of Ti/Pt/Au or a multiple-layer configuration of Ti/Au.

Various compound semiconductor layers (e.g. GaN-based compound semiconductor layers) that constitute the optical semiconductor element etc. of the present disclosure are sequentially formed on a substrate or substratum; here, as the substrate or substratum, a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, and a Si substrate, and a substrate in which an underlayer and/or a buffer layer is formed on a surface (major surface) of these substrates may be given as well as a sapphire substrate. In the case where mainly a GaN-based compound semiconductor layer is formed on the substrate or substratum, a GaN substrate is preferred because of the small density of defects; it is known that the properties of a GaN substrate change between polar, non-polar, and semi-polar, depending on the growth plane. As the method for forming various compound semiconductor layers (e.g. GaN-based compound semiconductor layers) that constitute the optical semiconductor element etc. of the present disclosure, the metal organic chemical vapor deposition method (MOCVD method or MOVPE method), the molecular beam epitaxy method (MBE method), the hydride vapor phase epitaxy method in which a halogen contributes to transport or reaction, etc. may be given.

Here, trimethylgallium (TMG) gas and triethylgallium (TEG) gas may be given as the organic gallium source gas in the MOCVD method, and ammonia gas and hydrazine gas may be given as the nitrogen source gas. In the formation of a GaN-based compound semiconductor layer having the n-conductivity type, silicon (Si), for example, may be added as the n-type impurity (n-type dopant); and in the formation of a GaN-based compound semiconductor layer having the p-conductivity type, magnesium (Mg), for example, may be added as the p-type impurity (p-type dopant). In the case where aluminum (Al) or indium (In) is contained as a constituent atom of the GaN-based compound semiconductor layer, trimethylaluminum (TMA) gas may be used as the Al source, and trimethylindium (TMI) gas may be used as the In source. Monosilane gas (SiH$_4$ gas) may be used as the Si source, and cyclopentadienylmagnesium gas, methylcyclopentadienylmagnesium, and bis(cyclopentadienyl)magnesium (Cp$_2$Mg) may be used as the Mg source. As the n-type impurity (n-type dopant), Ge, Se, Sn, C, Te, S, O, Pd, and Po may be given as well as Si; and as the p-type impurity (p-type dopant), Zn, Cd, Be, Ca, Ba, C, Hg, and Sr may be given as well as Mg.

In the case where the stacked structure body has a ridge stripe structure in the optical semiconductor element etc. of the present disclosure, this ridge stripe structure may be formed of only the second compound semiconductor layer, may be formed of the second compound semiconductor layer and the third compound semiconductor layer, or may be formed of the second compound semiconductor layer, the third compound semiconductor layer, and a portion in the thickness direction of the second compound semiconductor layer. In forming the ridge stripe structure, the compound semiconductor layer may be patterned by a dry etching method, for example.

As a preferred semiconductor laser element in the laser device assembly of the present disclosure, a mode-locked semiconductor laser element including a saturable absorption region can be given as described above. Oscillation characteristics can be controlled on the basis of a reverse bias voltage $V_{sa}$ applied to the saturable absorption region, which facilitates the control of oscillation characteristics. Specifically, the mode-locked semiconductor laser element is formed of a bi-section type mode-locked semiconductor laser element in which the light emitting region and the saturable absorption region are juxtaposed along the length direction (X direction) of the stacked structure body.

The bi-section type mode-locked semiconductor laser element includes (a) a stacked structure body in which a first compound semiconductor layer having a first conductivity type and made of a GaN-based compound semiconductor, a third compound semiconductor layer (active layer) that forms a light emitting region and a saturable absorption region made of a GaN-based compound semiconductor, and a second compound semiconductor layer having a second conductivity type different from the first conductivity type and made of a GaN-based compound semiconductor are sequentially stacked, (b) a second electrode formed on the second compound semiconductor layer, and (c) a first electrode electrically connected to the first compound semiconductor layer.

A configuration is possible in which the second electrode is separated by an isolation trench into a first region of the second electrode for sending a direct current to the first electrode via the light emitting region to create a forward bias state and a second region of the second electrode for applying an electric field to the saturable absorption region. A direct current is sent from the first region of the second electrode to the first electrode via the light emitting region to create a forward bias state, and a voltage (a reverse bias voltage $V_{sa}$) is applied between the first electrode and the second region of the second electrode to apply an electric field to the saturable absorption region; thus, mode-locking operation can be performed. That is, in the mode-locked semiconductor laser element, a current is sent from the first region of the second electrode to the first electrode via the stacked structure body, so that a light pulse is generated in the light emitting region. The first compound semiconductor layer is formed on a substrate or a substratum.

In the mode-locked semiconductor laser element, a configuration in which the length of the saturable absorption region is shorter than the length of the light emitting region is possible. Alternatively, a configuration in which the sum of the length of the first region of the second electrode and the length of the second region of the second electrode is shorter than the length of the third compound semiconductor layer (active layer) is possible. Note that "length" refers to a length along the length direction (X direction) of the stacked structure body. As the arrangement state of the first region of the second electrode and the second region of the second electrode, specifically, (1) a state in which one first region of the second electrode and one second region of the second electrode are provided, and the first region of the second electrode and the second region of the second electrode are placed across an isolation trench, (2) a state in which one first region of the second electrode and two second regions of the second electrode are provided, and one end of the first region of the second electrode faces one second region of the second electrode across one isolation trench and the other end of the first region of the second electrode faces the other second region of the second electrode across another isolation trench, and (3) a state in which two first regions of the second electrode and one second region of the second electrode are provided, and an end of the second region of the second electrode faces one first region of the second electrode across one isolation trench and the other end of the second region of the second electrode faces the other first region of the second electrode across another isolation trench (that is, a structure in which the second region of the second electrode is sandwiched by the first regions of the second electrode) may be given. In a wide range, (4) a state in which N first regions of the second electrode and (N−1) second regions of the second electrode are provided, and first regions of the second electrode are placed to sandwich a second region of the second electrode, and (5) a state in which N second regions of the second electrode and (N−1) first regions of the second electrode are provided, and second regions of the second electrode are placed to sandwich a first region of the second electrode may be given. The states of (4) and (5) are, in other words, (4') a state in which N light emitting regions [carrier injection regions, gain regions] and (N−1) saturable absorption regions [carrier non-injection regions] are provided, and light emitting regions are placed to sandwich a saturable absorption region, and (5') a state in which N saturable absorption regions [carrier non-injection regions] and (N−1) light emitting regions [carrier injection regions, gain regions] are provided, and saturable absorption regions are placed to sandwich a light emitting region.

Employing the structures of (3), (5), and (5') makes damage less likely to occur at the light emitting end surface of the mode-locked semiconductor laser element.

In the mode-locked semiconductor laser element, the width of the isolation trench separating the first region of the second electrode from the second region of the second electrode may be not less than 1 μm and not more than 50% of the length along the length direction (X direction) of the stacked structure body in the semiconductor laser element, preferably not less than 10 μm and not more than 10% of the length along the length direction (X direction) of the stacked structure body in the semiconductor laser element. In addition, the distance (D) from the top surface of a portion of the second compound semiconductor layer that is located on the outside with respect to both side surfaces of the ridge stripe structure to the third compound semiconductor layer (active layer) is preferably $1.0 \times 10^{-7}$ m (0.1 μm) or more. By thus setting the distance (D), the saturable absorption region can be reliably formed at both sides (Y direction) of the third compound semiconductor layer. The upper limit of the distance (D) may be determined on the basis of a rise in threshold current, temperature characteristics, deterioration of the rate of rise in current in long-term driving, or the like.

The electric resistance value between the first region of the second electrode and the second region of the second electrode may be $1 \times 10^2 \Omega$ or more, preferably $1 \times 10^3 \Omega$ or more, and more preferably $1 \times 10^4 \Omega$ or more. Alternatively, the electric resistance value between the first portion of the second electrode and the second region of the second electrode may be $1 \times 10$ times or more, preferably $1 \times 10^2$ times or more, and more preferably $1 \times 10^3$ times or more the electric resistance value between the second electrode and the first electrode.

By employing a configuration in which the electric resistance value between the first region of the second electrode and the second region of the second electrode is set to $1 \times 10^2 \Omega$ or more or to 10 times or more the electric resistance value between the second electrode and the first electrode, the flow of leakage current from the first region of the second electrode to the second region of the second electrode can be reliably suppressed. That is, the amount of current injection into the light emitting region (carrier injection region, gain region) can be increased and, at the same time, the reverse bias voltage $V_{sa}$ applied to the saturable absorption region (carrier non-injection region) can be increased. Such a high electric resistance value between the first region of the second electrode and the second region of the second electrode can be achieved by simply separating the second electrode into the first region of the second electrode and the second region of the second electrode by means of the isolation trench. That is, light pulse generation by mode-locking can be obtained more easily.

In the mode-locked semiconductor laser element, as described above, a configuration in which a reverse bias voltage $V_{sa}$ is applied between the first electrode and the second region of the second electrode (that is, a configuration in which the first electrode is used as the positive electrode and the second region of the second electrode is used as the negative electrode) is preferable. To the second region of the second electrode, a pulse current or a pulse voltage synchronized with the pulse current or the pulse voltage applied to the first region of the second electrode may be applied, or a DC bias may be applied. A configuration in which a current is sent from the second electrode to the first electrode via the light emitting region and an external electric signal is superimposed from the second electrode to the first electrode via the light emitting region is possible. Thereby, synchronization between the laser light and the external electric signal can be made. Alternatively, a configuration in which an optical signal is caused to enter through one end surface of the stacked structure body is possible. Also by this, synchronization between the laser light and the optical signal can be made. To operate the optical semiconductor element etc. of the present disclosure as a mode-locked semiconductor laser, a saturable absorption region may be provided additionally by using the waveguide structure in the present disclosure as a gain medium. A scheme may be used in which an electrode is provided additionally in part of the semiconductor waveguide to apply a reverse bias voltage to the saturable absorption region, or a semiconductor saturable absorber mirror (SESAM) may be used.

The mode-locked semiconductor laser element is not limited to a bi-section type (bi-electrode type) semiconductor laser element, and can also employ a multi-section type (multi-electrode type) semiconductor laser element, or a semiconductor laser element of a saturable absorber layer (SAL) type in which the light emitting region and the saturable absorption region are arranged in the perpendicular direction or a weakly index guide (WI) type in which the saturable absorption region is provided along the ridge stripe structure.

The optical semiconductor element or the laser device assembly of the present disclosure can be used for, for example, fields such as optical disk systems, communication fields, optical information fields, optoelectronic integrated circuits, fields of application of nonlinear optical phenomena, optical switches, laser measurement fields, various analysis fields, ultrafast spectroscopy fields, multiphoton excitation spectroscopy fields, mass spectrometry fields, fields of microspectroscopy utilizing multiphoton absorption, quantum control of chemical reactions, nanoscale three-dimensional processing fields, various processing fields of application of multiphoton absorption, medical fields, bioimaging, quantum info-communications, and quantum information processing.

Example 1

Figure 1B:
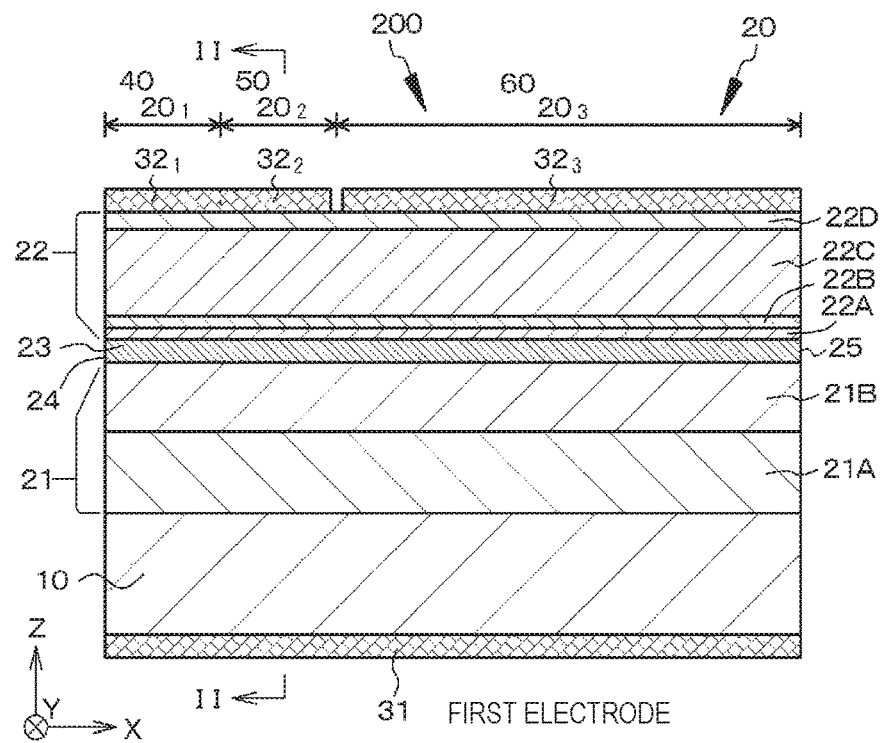
FIG. 1B is a schematic cross-sectional view along the XZ plane of the optical semiconductor element of Example 1 (semiconductor optical amplifier).
Figure 2:
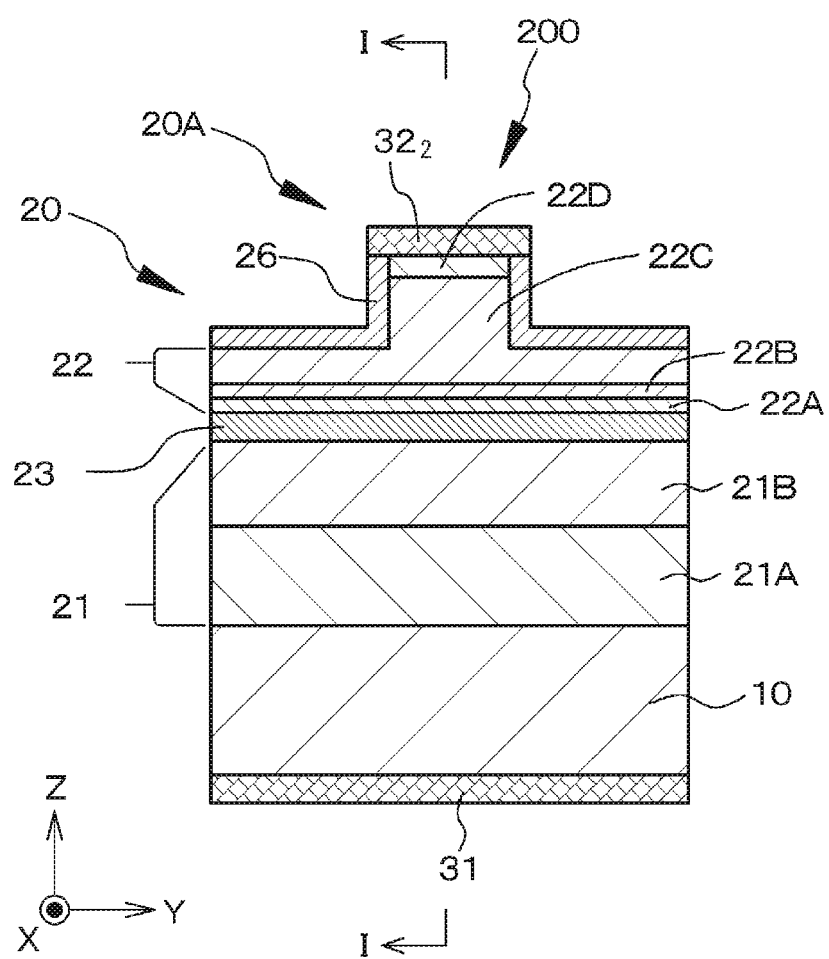
FIG. 2 is a schematic partial cross-sectional view along the YZ plane of the optical semiconductor element of Example 1 (semiconductor optical amplifier).
Figure 3:
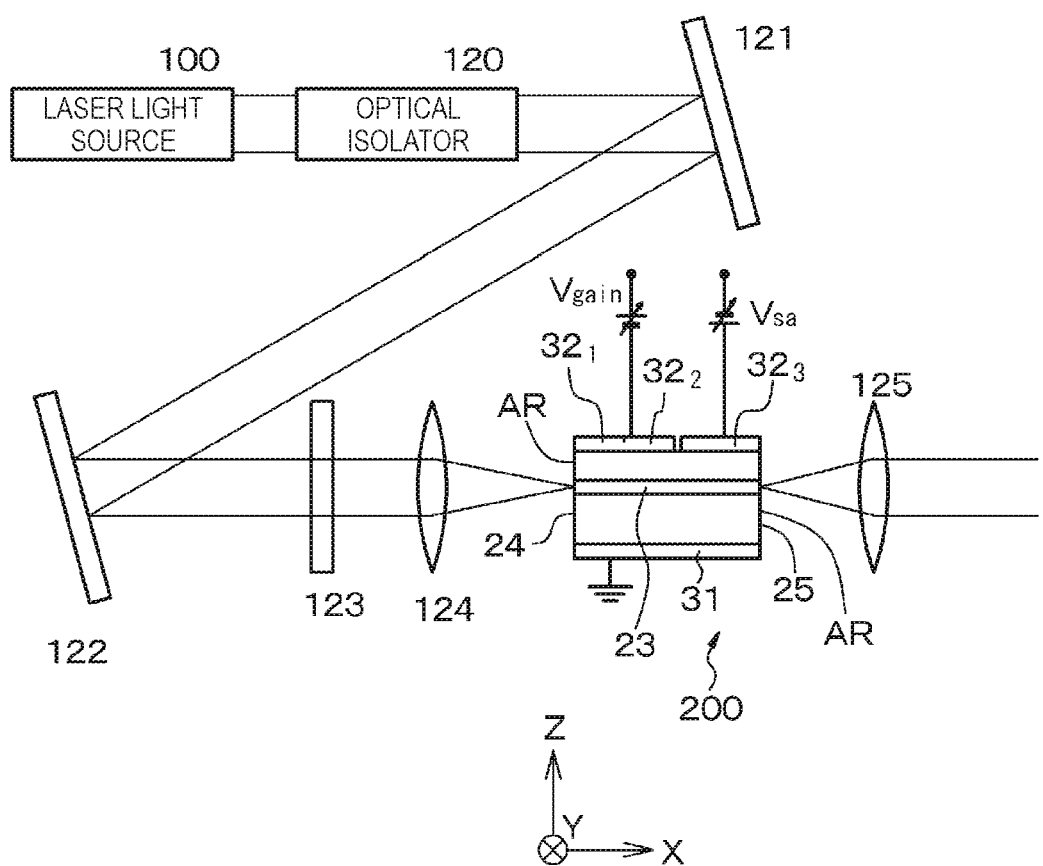
FIG. 3 is a conceptual diagram of a laser device assembly of Example 1.

Example 1 relates to an optical semiconductor element (light emitting element) and a laser device assembly of the present disclosure. The optical semiconductor element of Example 1 is, specifically, a semiconductor optical amplifier (SOA), more specifically a transmissive semiconductor optical amplifier. FIG. 1A is a schematic plan view of the optical semiconductor element of Example 1 (semiconductor optical amplifier), FIG. 1B is a schematic cross-sectional view along the XZ plane, and FIG. 2 is a schematic partial cross-sectional view along the YZ plane. FIG. 1B is a schematic cross-sectional view along arrows I-I of FIGS. 1A and 2, and FIG. 2 is a schematic cross-sectional view along arrows II-II of FIG. 1B. FIG. 3 is a conceptual diagram of the laser device assembly of Example 1.

The optical semiconductor element of Example 1 (hereinafter called "semiconductor optical amplifier 200") includes a stacked structure body 20 formed of a first compound semiconductor layer 21, a third compound semiconductor layer (active layer) 23, and a second compound semiconductor layer 22 (a stacked structure body in which the compound semiconductor layers 21, 23, and 22 are sequentially stacked), and a fundamental mode waveguide region 40 with a waveguide width $W_1$, a free propagation region 50 with a width larger than $W_1$, and a light emitting region 60 having a tapered shape (flared shape) with a width increasing toward a light emitting end surface are arranged (juxtaposed) in sequence. When the length of the free propagation region 50 is denoted by $L_2$, the diffraction angle of light that proceeds from the fundamental mode waveguide region 40 toward the free propagation region 50 is denoted by $\theta_1$, and the width of a boundary portion between the light emitting region 60 and the free propagation region 50 is denoted by $W_2$, $$W_2 > 2L_2 \cdot \tan(\theta_1) + W_1$$

is satisfied. The first compound semiconductor layer 21 has a first conductivity type (specifically the n-conductivity type), and the second compound semiconductor layer 22 has a second conductivity type (specifically the p-conductivity type) different from the first conductivity type.

In the semiconductor optical amplifier 200 of Example 1, a first portion $32_1$ of a second electrode is formed on the second compound semiconductor layer 22 in a first region $20_1$ of the stacked structure body 20 that forms the fundamental mode waveguide region 40. A second portion $32_2$ of the second electrode is formed on the second compound semiconductor layer 22 in a second region 20₂ of the stacked structure body 20 that forms the free propagation region 50. A third portion 32₃ of the second electrode is formed on the second compound semiconductor layer 22 in a third region 20₃ of the stacked structure body 20 that forms the light emitting region 60. In addition, a first electrode 31 electrically connected to the first compound semiconductor layer 21 that forms the stacked structure body 20 is provided. The stacked structure body 20 is made of a GaN-based compound semiconductor. Note that the first portion $32_1$, the second portion $32_2$, and the third portion $32_3$ of the second electrode are collectively denoted by a reference number 32 or a reference number 32A in some cases.

Here, in the semiconductor optical amplifier 200 of Example 1, the first portion $32_1$ of the second electrode is continuous with the second portion $32_2$ of the second electrode. On the other hand, the second portion $32_2$ of the second electrode is separated from the third portion $32_3$ of the second electrode. ADC voltage (a forward bias) $V_{gain}$ is applied between the first portion $32_1$ of the second electrode and the second portion $32_2$ of the second electrode, and the first electrode 31, and a pulsed voltage (e.g., a pulsed forward bias voltage $V_{gain}$ of 100 kilohertz) is applied between the third portion $32_3$ of the second electrode and the first electrode 31. A current of $3 \times 10^3$ amperes or more per 1 cm² of the third portion of the second electrode, specifically, a current of $6 \times 10^3$ amperes, for example, is sent to the third portion $32_3$ of the second electrode. Applying a pulsed voltage between the third portion $32_3$ of the second electrode and the first electrode 31 makes it possible to send even more current between the third portion $32_3$ of the second electrode and the first electrode 31.

In the semiconductor optical amplifier 200 of Example 1, the first region $20_1$ of the stacked structure body 20 that forms the fundamental mode waveguide region 40, the second region $20_2$ of the stacked structure body 20 that forms the free propagation region 50, and the third region $20_3$ of the stacked structure body 20 that forms the light emitting region 60 have a ridge stripe structure 20A. That is, the semiconductor optical amplifier 200 of Example 1 as a whole has a separate confinement heterostructure (SCH structure) of a ridge stripe type.

Furthermore, in the semiconductor optical amplifier 200 of Example 1, when the average width of the free propagation region 50 is denoted by $W_{2-ave}$ and the width of a portion of the light emitting region 60 that faces the light emitting end surface (second end surface 25) is denoted by $W_3$, $$0.5 \ \mu m \leq W_1 \leq 2.5 \ \mu m$$

$$1.2 \leq W_{2-ave}/W_1 \leq 500$$

$$20 \ \mu m \leq W_3 \leq 650 \ \mu m$$

are satisfied.

The waveguide width $W_1$ of the fundamental mode waveguide region 40 is constant, and the width of the free propagation region 50 is also constant ($W_2$). The light emitting region 60 has a tapered shape with a width increasing toward the light emitting end surface (second end surface 25); a boundary line of the light emitting region 60 along the axis of the light emitting region 60 is straight-lined in the illustrated example. Note that the boundary line is not limited to this example and may be curved. The axes of the fundamental mode waveguide region 40, the free propagation region 50, and the light emitting region 60 are indicated by a dot-and-dash line; the axes of the fundamental mode waveguide region 40, the free propagation region 50, and the light emitting region 60 are on the same straight line.

Furthermore, the axis of the light emitting region 60 and the light emitting end surface (second end surface 25) cross each other at an acute angle (90 degrees$-\theta_3$ degrees).

A low-reflection coating layer (AR) is formed on a first end surface 24 and the second end surface 25, but the low-reflection coating layer is not illustrated. The low-reflection coating layer has a structure in which one titanium oxide layer and one aluminum oxide layer are stacked, for example. Laser light that enters through the first end surface 24 is optically amplified inside the semiconductor optical amplifier 200 and output through the light emitting end surface (second end surface 25) at the opposite side. Laser light is basically guided only in one direction.

The laser device assembly of Example 1 includes
a laser light source 100, and
the semiconductor optical amplifier (SOA) 200 that is formed of the optical semiconductor element of Example 1 and amplifies laser light emitted from the laser light source 100.

The axis of the light emitting region 60 and the light emitting end surface (second end surface 25) in the optical semiconductor element that forms the semiconductor optical amplifier 200 cross each other at an acute angle (90 degrees$-\theta_3$ degrees). In Example 1, the laser light source 100 is formed of a known continuous-wave laser device, and laser light emitted by the laser device enters the semiconductor optical amplifier 200. The width (specifically, the width $W_1$) of a portion of the fundamental mode waveguide region 40 where laser light from the laser light source 100 enters is equal to the width of the laser light that enters.

In the laser device assembly of Example 1 illustrated in FIG. 3, laser light emitted from the laser light source 100 enters a reflection mirror 122 via an optical isolator 120 and a reflection mirror 121. Laser light reflected by the reflection mirror 122 proceeds through a half-wave plate ($\lambda/2$ wave plate) 123 and a lens 124 to enter the semiconductor optical amplifier 200. The optical isolator 120 and the half-wave plate 123 are placed to prevent return light from the semiconductor optical amplifier 200 from proceeding toward the laser light source 100. Then, laser light is optically amplified in the semiconductor optical amplifier 200 and emitted outside the system via a lens 125.

Table 1 below shows specific data of the semiconductor optical amplifier 200 of Example 1. Note that $L_1$ and $L_3$ are the lengths of the fundamental mode waveguide region 40 and the light emitting region 60, respectively.

TABLE 1

| | |
|---|---|
| $W_1 =$ | 1.5 μm |
| $W_2 = W_{2-ave} =$ | 30 μm |
| $W_3 =$ | 0.135 mm |
| $L_1 =$ | 0.5 mm |
| $L_2 =$ | 0.2 mm |
| $L_3 =$ | 1.5 mm |
| $\theta_3 =$ | 3 degrees |
| $\theta_1 =$ | 2 degrees |
| $n_{1-ave} =$ | 2.5 |
| $\lambda_0 =$ | 405 nm |

In the semiconductor optical amplifier 200 of Example 1, specifically, a substratum 10 is made of an n-type GaN substrate, and the stacked structure body 20 is provided on the (0001) plane of the n-type GaN substrate. The (0001) plane of the n-type GaN substrate is also called the "c-plane," and is a crystal plane having polarity. The stacked structure body 20 formed of the first compound semiconductor layer 21, the third compound semiconductor layer (active layer) 23, and the second compound semiconductor layer 22 is made of a GaN-based compound semiconductor, specifically an AlInGaN-based compound semiconductor, and more specifically has the layer configuration shown in Table 2 below. Here, in Table 2, a compound semiconductor layer written in a lower position is a layer nearer to the substratum 10. The band gap of the compound semiconductor that forms the well layer in the third compound semiconductor layer (active layer) 23 is 3.06 eV. The active layer 23 has a quantum well structure including a well layer and a barrier layer, and the impurity (specifically, silicon (Si)) doping concentration of the barrier layer is not less than $2 \times 10^{17}$ cm$^{-3}$ and not more than $1 \times 10^{20}$ cm$^{-3}$. A stacked insulating film 26 formed of SiO$_2$/Si is formed on both sides of the ridge stripe structure 20A. The SiO$_2$ layer is the lower layer, and the Si layer is the upper layer. The second electrode (p-side ohmic electrode) 32 (the second electrode 32$_1$, 32$_2$, 32$_3$) is formed on a p-type GaN contact layer 22D corresponding to the top surface of the ridge stripe structure 20A. On the other hand, the first electrode (n-side ohmic electrode) 31 made of Ti/Pt/Au is formed on the back surface of the substratum 10. In Examples, the second electrode 32 is made of a Pd single layer with a thickness of 0.1 µm. A p-type AlGaN electron barrier layer 22A has a thickness of 10 nm, a second light guide layer (p-type AlGaN layer) 22B has a thickness of 100 nm, a second cladding layer (p-type AlGaN layer) 22C has a thickness of 0.5 µm, and the p-type GaN contact layer 22D has a thickness of 100 nm. The p-type electron barrier layer 22A, the second light guide layer 22B, the second cladding layer 22C, and the p-type contact layer 22D included in the second compound semiconductor layer 22 are doped with Mg at $1 \times 10^{19}$ cm$^{-3}$ or more (specifically, $2 \times 10^{19}$ cm$^{-3}$). On the other hand, a first cladding layer (n-type AlGaN layer) 21A has a thickness of 2.5 µm, and a first light guide layer (n-type GaN layer) 21B has a thickness of 1.25 µm. The thickness (1.25 µm) of the first light guide layer 21B is larger than the thickness (100 nm) of the second light guide layer 22B. Although the first light guide layer 21B is made of GaN, alternatively, the first light guide layer 21B can be made of a compound semiconductor that has a wider band gap than the active layer 23 and has a narrower band gap than the first cladding layer 21A.

TABLE 2

Second compound semiconductor layer 22
   p-type GaN contact layer (Mg-doped) 22D
   second cladding layer (p-type Al$_{0.05}$Ga$_{0.95}$N layer (Mg-doped)) 22C
   second light guide layer (p-type Al$_{0.01}$Ga$_{0.99}$N layer (Mg-doped)) 22B
   p-type Al$_{0.20}$Ga$_{0.80}$N electron barrier layer (Mg-doped) 22A
Third compound semiconductor layer (active layer) 23
   InGaN quantum well active layer
      (well layer: In$_{0.08}$Ga$_{0.92}$N/barrier layer: In$_{0.02}$Ga$_{0.98}$N)
First compound semiconductor layer 21
   first light guide layer (n-type GaN layer) 21B
   first cladding layer (n-type Al$_{0.03}$Ga$_{0.97}$N layer) 21A,
where
Well layer (two layers): 10 nm [non-doped]
Barrier layer (three layers): 12 nm [doping concentration (Si): $2 \times 10^{18}$ cm$^{-3}$]

Figure 4:
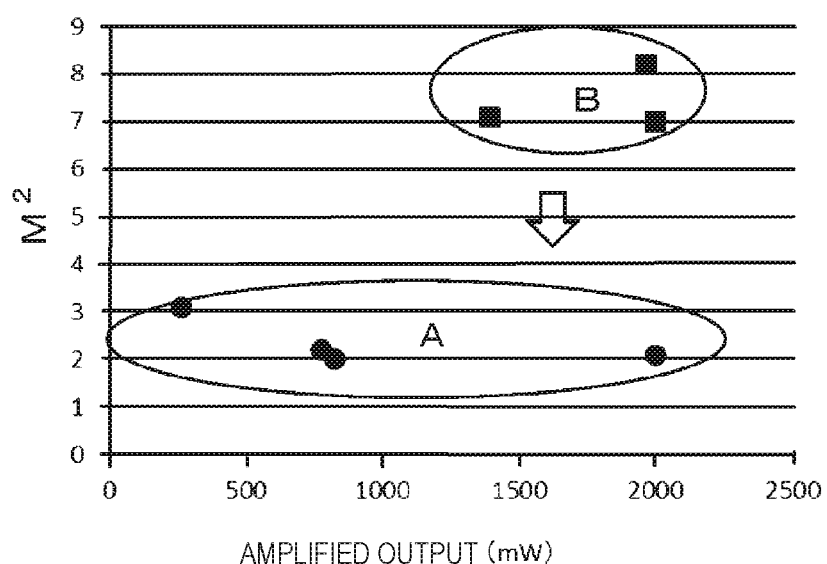
FIG. 4 is a graph showing measurement results of the M2 value of the optical semiconductor element of Example 1 (semiconductor optical amplifier).

In the semiconductor optical amplifier 200 of Example 1, a voltage applied to the second electrode 32A (32$_1$, 32$_2$, 32$_3$) and a current sent from the second electrode 32A to the first electrode 31 were varied variously, and an M$^2$ value, which is an index of light intensity and light beam quality output from the semiconductor optical amplifier 200, was measured; results are shown as "A" in FIG. 4. Measurement results of the M$^2$ value in Comparative Example 1 are shown as "B" in FIG. 4. In FIG. 4, the horizontal axis represents a value of light intensity output from the semiconductor optical amplifier (amplified output (unit: milliwatt)), and the vertical axis represents the M$^2$ value.

In the semiconductor optical amplifier of Comparative Example 1, the free propagation region 50 in the semiconductor optical amplifier 200 of Example 1 is not formed, and the fundamental mode waveguide region 40 is extended to the free propagation region 50 in the semiconductor optical amplifier 200 of Example 1.

According to FIG. 4, the semiconductor optical amplifier 200 of Example 1 exhibited a low M$^2$ value, in spite of high light intensity output from the semiconductor optical amplifier. That is, a light beam of laser light emitted from the semiconductor optical amplifier 200 of Example 1 is a high-quality light beam. On the other hand, the semiconductor optical amplifier of Comparative Example 1 in which the free propagation region 50 is not formed achieved an increase in output power but exhibited a high M$^2$ value, and laser light with sufficiently high quality was not able to be obtained. According to the results, the value of M$^2$ of light emitted from the light emitting region 60 is preferably 3 or less.

As described above, in the optical semiconductor element of Example 1, or an optical semiconductor element that forms the semiconductor optical amplifier in the laser device assembly of Example 1, the light emitting region has a tapered shape with a width increasing toward the light emitting end surface; thus, an increase in output power of emitted light can be achieved. Moreover, since the free propagation region with a width larger than the waveguide width W$_1$ of the fundamental mode waveguide region is provided, an improvement in beam quality of emitted light can be achieved.

Example 2

Figure 5A:
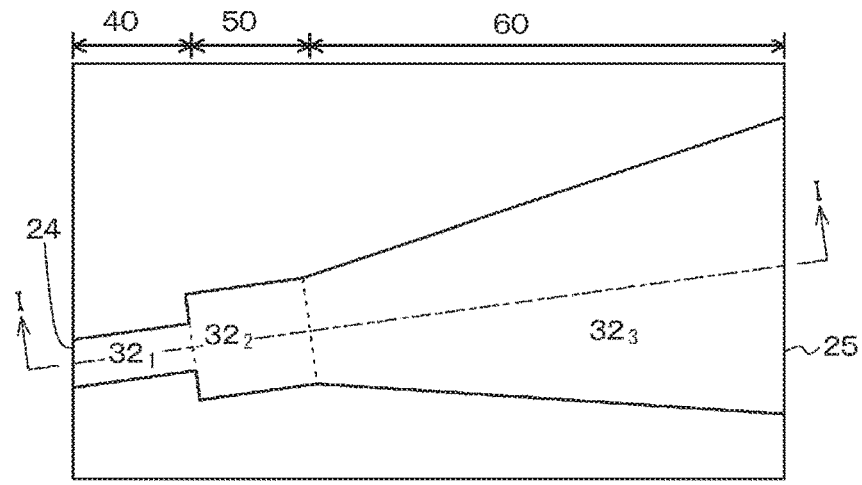
FIG. 5A is a schematic plan view of an optical semiconductor element of Example 2 (semiconductor optical amplifier)
Figure 5B:
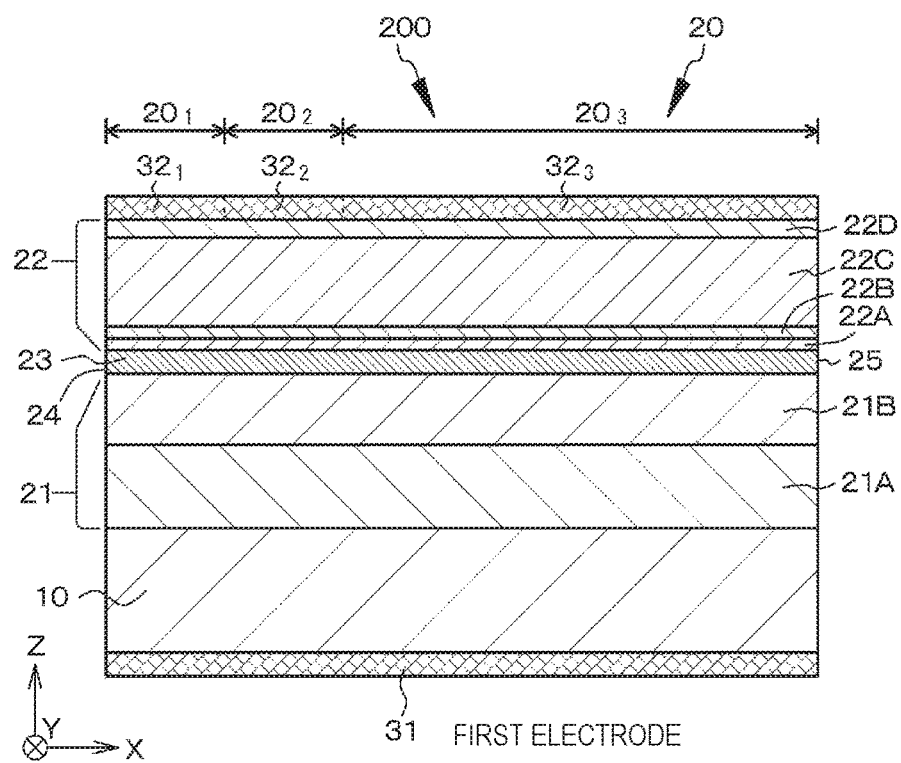
FIG. 5B is a schematic cross-sectional view along the XZ plane of the optical semiconductor element of Example 2 (semiconductor optical amplifier).

Example 2 is a modification of Example 1. FIG. 5A is a schematic plan view of the optical semiconductor element of Example 2 (semiconductor optical amplifier), and FIG. 5B is a schematic cross-sectional view along the XZ plane. FIG. 5B is a schematic cross-sectional view along arrows I-I of FIG. 5A.

In the optical semiconductor element 200 of Example 2, the first portion 32$_1$ of the second electrode, the second portion 32$_2$ of the second electrode, and the third portion 32$_3$ of the second electrode are continuous with each other, and a DC voltage (a forward bias) is applied between the first portion 32$_1$ of the second electrode, the second portion 32$_2$ of the second electrode, and the third portion 32$_3$ of the second electrode, and the first electrode 31. The optical semiconductor element and the laser device assembly of Example 2 have the same configuration and structure as the optical semiconductor element and the laser device assembly of Example 1 except for the above points, and therefore are not described in detail.

Example 3

Figure 6A:
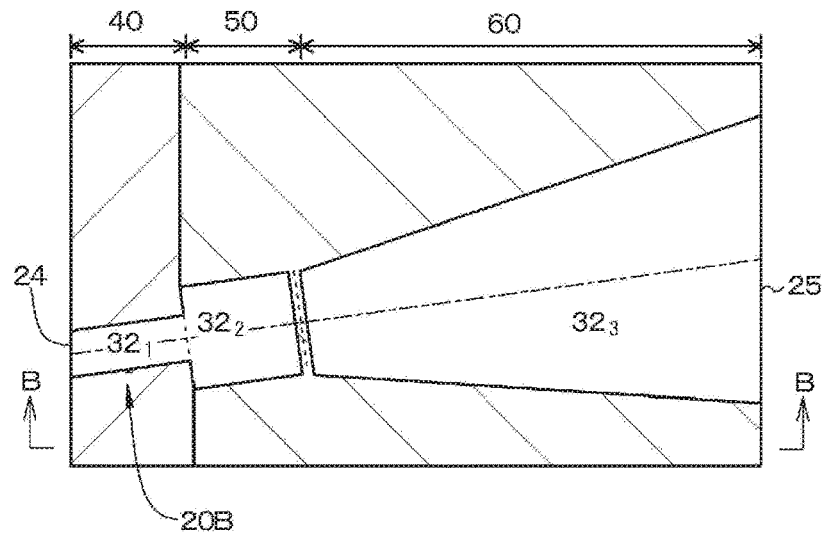
FIG. 6A is a schematic plan view of an optical semiconductor element of Example 3 (semiconductor optical amplifier)
Figure 6B:
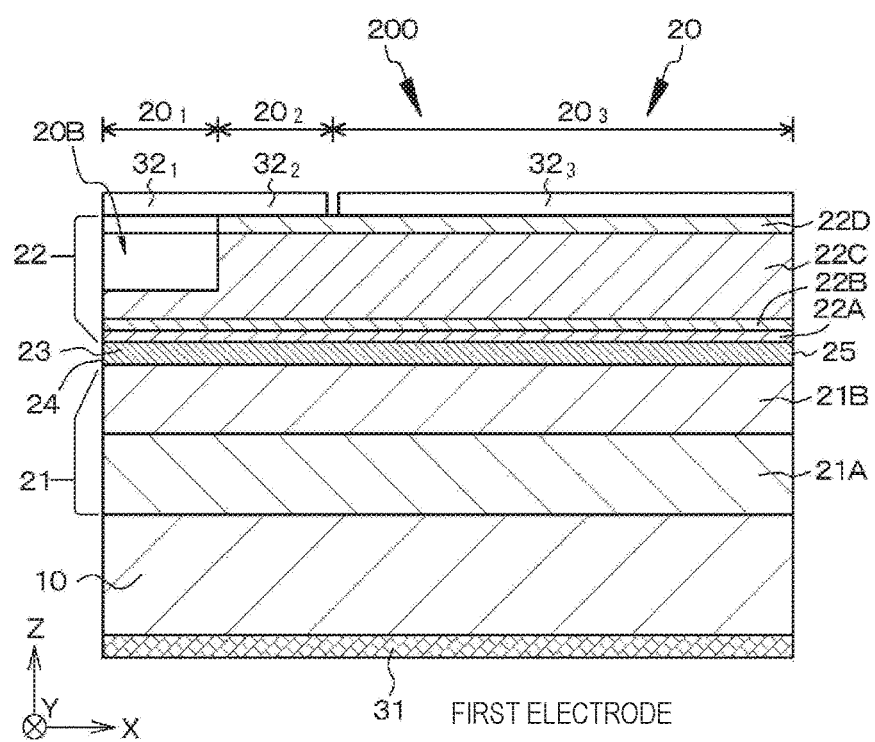
FIG. 6B is a schematic cross-sectional view along the XZ plane of the optical semiconductor element of Example 3 (semiconductor optical amplifier).

Example 3 is a modification of Examples 1 and 2. FIG. 6A is a schematic plan view of the optical semiconductor element of Example 3 (semiconductor optical amplifier), and FIG. 6B is a schematic cross-sectional view along the XZ plane. FIG. 6B is a schematic cross-sectional view along arrows B-B of FIG. 6A. The example illustrated in FIGS. 6A and 6B is a modification example of Example 1.

In the optical semiconductor element 200 of Example 3, only the first region $20_1$ of the stacked structure body 20 that forms the fundamental mode waveguide region 40 has a ridge stripe structure 20B. In the second region $20_2$ of the stacked structure body 20 that forms the free propagation region 50 and the third region $20_3$ of the stacked structure body 20 that forms the light emitting region 60, each region is partitioned on the basis of a gain-guiding scheme or an index-guiding scheme. Note that in FIG. 6A, the second compound semiconductor layer 22 exposed near the fundamental mode waveguide region 40 (more specifically, the exposed top surface of the second cladding layer 22C) is hatched with lines running from the upper right to the lower left, and the second compound semiconductor layer 22 exposed near the free propagation region 50 and the light emitting region 60 (more specifically, the exposed top surface of the p-type contact layer 22D) is hatched with lines running from the upper left to the lower right. The optical semiconductor element and the laser device assembly of Example 3 have the same configuration and structure as the optical semiconductor element and the laser device assembly of Example 1 except for the above points, and therefore are not described in detail.

Example 4

Figure 7A:
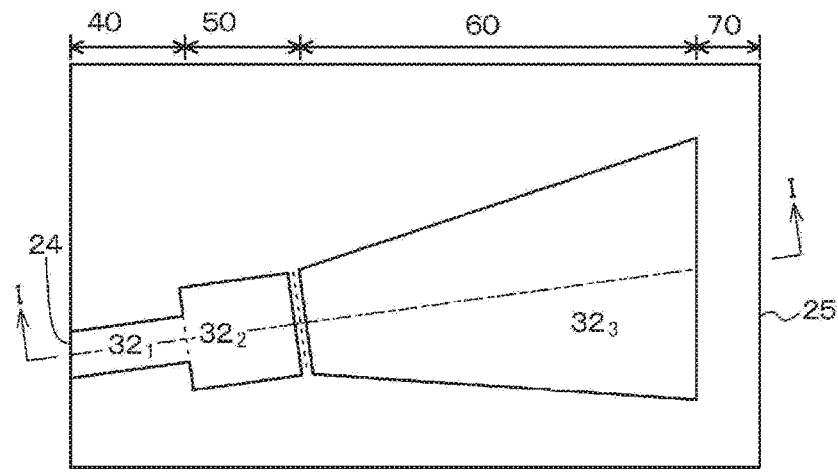
FIG. 7A is a schematic plan view of an optical semiconductor element of Example 4 (semiconductor optical amplifier)
Figure 7B:
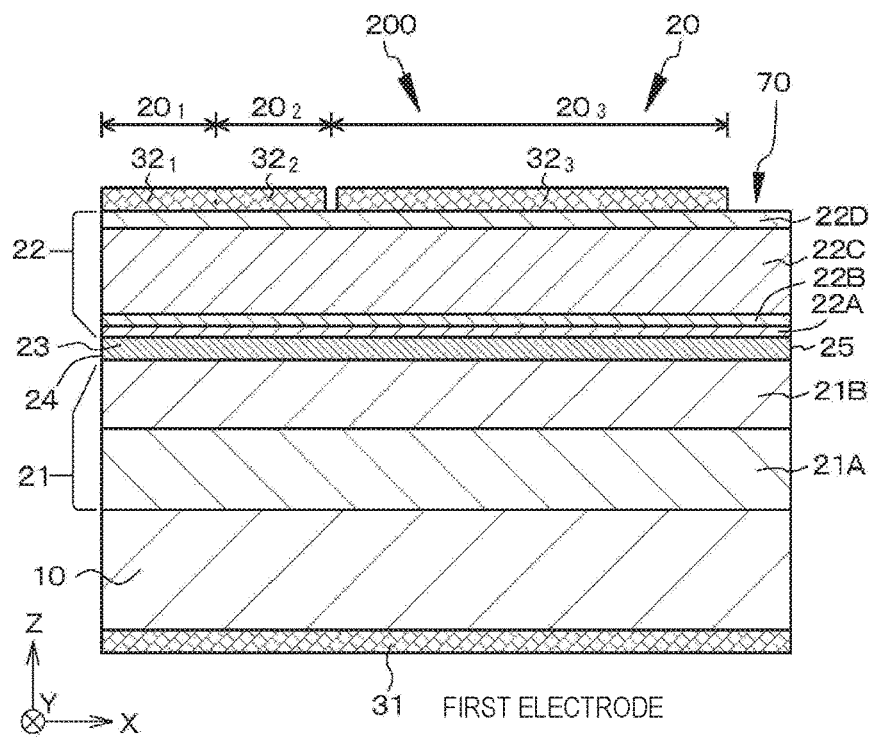
FIG. 7B is a schematic cross-sectional view along the XZ plane of the optical semiconductor element of Example 4 (semiconductor optical amplifier).

Example 4 is a modification of Examples 1 to 3. FIG. 7A is a schematic plan view of the optical semiconductor element of Example 4 (semiconductor optical amplifier), and FIG. 7B is a schematic cross-sectional view along the XZ plane of the optical semiconductor element of Example 4 (semiconductor optical amplifier). FIG. 7B is a schematic cross-sectional view along arrows I-I of FIG. 7A. The example illustrated in FIGS. 7A and 7B is a modification example of Example 1.

In the optical semiconductor element of Example 4, a current non-injection region 70 is provided near the light emitting end surface (second end surface 25), which configuration can prevent occurrence of damage at the light emitting end surface (second end surface 25). The current non-injection region 70 is, specifically, formed of the stacked structure body of Example 1, and has the same configuration and structure as the light emitting region 60 except that the second electrode is not provided. The length of the current non-injection region 70 in the X direction is set to 10 µm. The configuration and structure of the optical semiconductor element and the laser device assembly of Example 4 can be the same as the configuration and structure of the optical semiconductor element and the laser device assembly of Examples 1 to 3 except for the above points, and therefore are not described in detail.

Providing a carrier non-injection region in this manner suppresses the occurrence of a phenomenon in which the relative refractive index of a compound semiconductor layer increases when light intensity of incident laser light increases, and enables laser light emitted through the light emitting end surface (second end surface 25) of the semiconductor optical amplifier to diverge in the width direction easily. This results in an increase in the area of the light emitting end surface that is occupied by a region where laser light is emitted from the semiconductor optical amplifier 200, leading to a further increase in output power of the semiconductor optical amplifier. Note that a current non-injection region may be provided near the first end surface 24, or a current non-injection region may be provided near the second end surface 25 and the first end surface 24.

Example 5

Figure 8A:
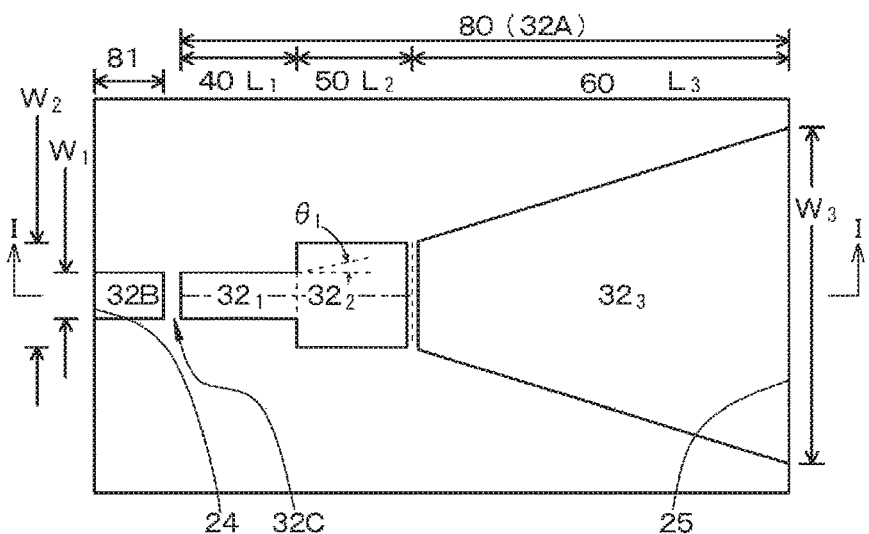
FIG. 8A is a schematic plan view of an optical semiconductor element of Example 5 (mode-locked semiconductor laser element)
Figure 8B:
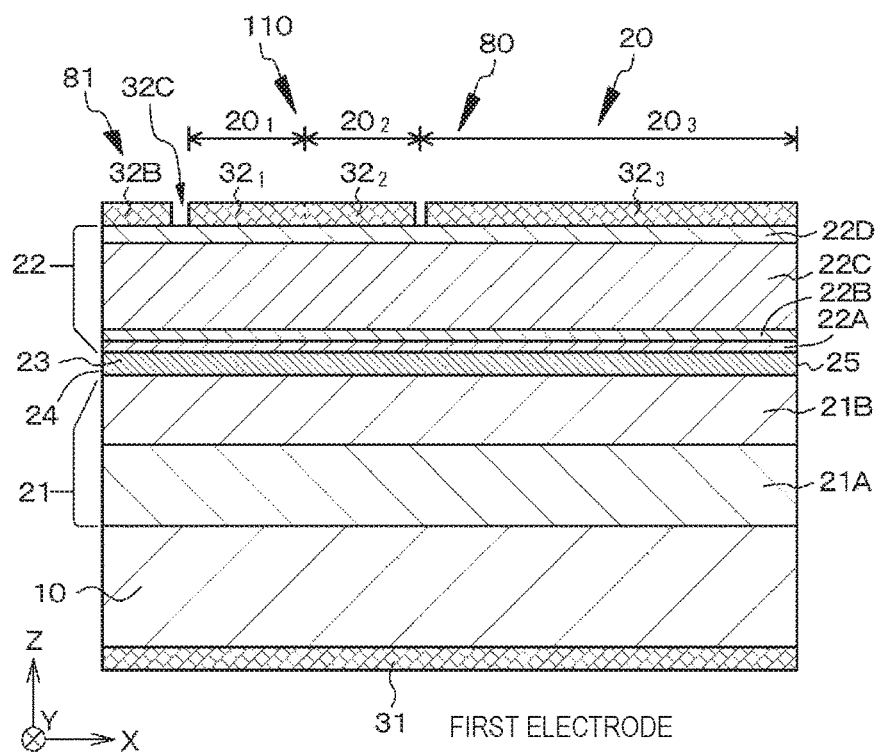
FIG. 8B is a schematic cross-sectional view along the XZ plane of the optical semiconductor element of Example 5 (mode-locked semiconductor laser element).

Example 5 is a modification of Example 1, in which modification the optical semiconductor element (light emitting element) is formed of a semiconductor laser element, specifically, a mode-locked semiconductor laser element. FIG. 8A is a schematic plan view of the optical semiconductor element of Example 5 (mode-locked semiconductor laser element), and FIG. 8B is a schematic cross-sectional view along the XZ plane. FIG. 8B is a schematic cross-sectional view along arrows I-I of FIG. 8A. The example illustrated in FIGS. 8A and 8B is a modification example of Example 1. FIGS. 9A, 9B, 10A, 10B, and 10C are conceptual diagrams of laser device assemblies in Example 5.

Specifically, a mode-locked semiconductor laser element 110 of Example 5 differs from the optical semiconductor element 200 having the configuration and structure described in Example 1 in the following points.

That is, a saturable absorption region 81 is provided between the first end surface 24 and the fundamental mode waveguide region 40. Specifically, the saturable absorption region 81 has the same configuration and structure as the stacked structure body 20 of Example 1. A second region 32B of the second electrode is formed on the second compound semiconductor layer 22 of the stacked structure body 20 that forms the saturable absorption region 81. Note that the first portion $32_1$, the second portion $32_2$, and the third portion $32_3$ of the second electrode are collectively called a first region 32A of the second electrode. The second region 32B of the second electrode is separated from the first region 32A of the second electrode by an isolation trench 32C.

Depending on the configuration of the semiconductor laser element, a high-reflection coating layer (HR) may be formed, instead of a low-reflection coating layer (AR), on the first end surface. Although $θ_3$ is 0 degrees in the illustrated example, $θ_3$ is not necessarily 0 degrees.

Specifically, the mode-locked semiconductor laser element 110 is formed of a bi-section type mode-locked semiconductor laser element having a light emitting wavelength in the 405 nm band, in which the light emitting region and the saturable absorption region are juxtaposed along the X direction (along the length direction of the stacked structure body). More specifically, the bi-section type mode-locked semiconductor laser element 110 in Example 5 includes, as illustrated in FIGS. 8A and 8B, (a) a stacked structure body in which the first compound semiconductor layer 21 having a first conductivity type (in Examples, the n-conductivity type) and made of a GaN-based compound semiconductor, the third compound semiconductor layer (active layer) 23 that forms a light emitting region (gain region) 80 and the saturable absorption region 81 made of a GaN-based compound semiconductor, and the second compound semiconductor layer 22 having a second conductivity type (in Examples, the p-conductivity type) different from the first conductivity type and made of a GaN-based compound semiconductor are sequentially stacked, (b) the second electrode 32A. 32B formed on the second compound semiconductor layer 22, and (c) the first electrode 31 electrically connected to the first compound semiconductor layer 21.

The second electrode is separated by the isolation trench 32C into the first region 32A of the second electrode for sending a direct current to the first electrode 31 via the light emitting region (gain region) 80 to create a forward bias state and the second region 32B of the second electrode for applying an electric field to the saturable absorption region 81 (the second region 32B of the second electrode for applying a reverse bias voltage $V_{sa}$ to the saturable absorption region 81). Here, the electric resistance value between the first region 32A of the second electrode (specifically, the first portion $32_1$ of the second electrode) and the second region 32B of the second electrode (occasionally called an "isolation resistance value") is 1×10 times or more, specifically 1.5×10³ times, the electric resistance value between the first region 32A of the second electrode (specifically, the first portion $32_1$ of the second electrode) and the first electrode 31. The electric resistance value between the first region 32A of the second electrode (specifically, the first portion $32_1$ of the second electrode) and the second region 32B of the second electrode (isolation resistance value) is 1×10²Ω or more, specifically 1.5×10⁴Ω. The length of the stacked structure body of the mode-locked semiconductor laser element 110 is set to 600 μm, and the lengths of the first region 32A of the second electrode, the second region 32B of the second electrode, and the isolation trench 32C are set, respectively, to 560 μm, 30 μm, and 10 μm.

Figure 9A:
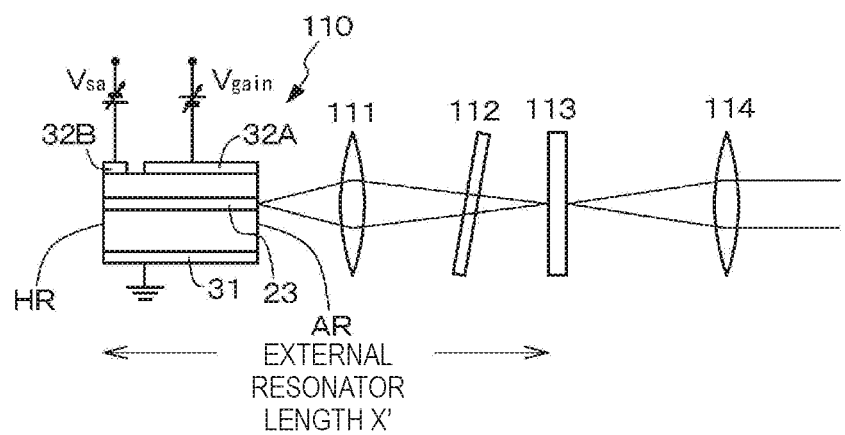
FIGS. 9A and 9B are conceptual diagrams of laser device assemblies in Example 5.

FIGS. 9A, 9B, 10A, 10B, and 10C are conceptual diagrams of laser device assemblies in Example 5. The laser device assembly illustrated in FIG. 9A is of an external resonator type. That is, the laser device assembly includes the mode-locked semiconductor laser element 110 formed of the optical semiconductor element of Example 5, a lens 111, an optical filter 112, an external mirror 113, and a lens 114. Laser light emitted from the mode-locked semiconductor laser element 110 is emitted outside via an optical isolator (not illustrated). A low-reflection coating layer (AR) or an anti-reflection coating layer (AR) having a structure in which one titanium oxide layer and one aluminum oxide layer are stacked, for example, is formed on the light emitting end surface (second end surface 25) of the mode-locked semiconductor laser element 110. A high-reflection coating layer (HR) is formed on the first end surface 24 facing the second end surface. An external resonator is composed of the first end surface 24 of the mode-locked semiconductor laser element 110 and the external mirror 113, and a light beam is extracted from the external mirror 113. Mainly a band-pass filter is used as the optical filter 112, and is inserted in order to control the oscillation wavelength of the laser. The repeating frequency f of a light pulse train is determined by the external resonator length X', and is expressed by the following formula. Here, c is the speed of light, and n is the refractive index of the waveguide. The value of the external resonator length (X', unit: mm) is set to 100 mm. The light reflectance of the second end surface 25 of the stacked structure body 20 from which a light beam (light pulse) is emitted is 0.5% or less (e.g., 0.3%), and the light reflectance of the first end surface 24 of the stacked structure body 20 at which a light beam (light pulse) is reflected is, for example, not less than 85% and less than 100% (e.g., 95%). Furthermore, the optical filter 112 has a light transmittance of, for example, not less than 85% and less than 100% (e.g., 90%), a half-width of more than 0 nm and not more than 2 nm (e.g., 1 nm), and a peak wavelength of not less than 400 nm and not more than 450 nm (e.g., 410 nm), and the external mirror 113 has a light reflectance of more than 0% and less than 100% (e.g., 20%). Needless to say, the values of these various parameters are examples, and can be altered as appropriate.

$$f=c/(2n\cdot X')$$

Figure 9B:
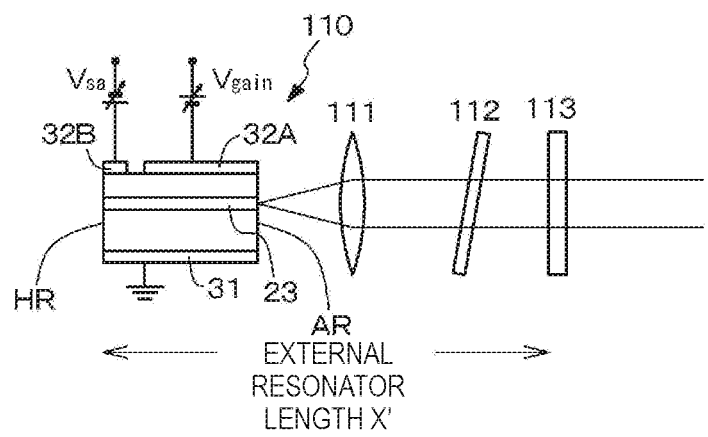

Also in an external resonator of a collimating type illustrated in FIG. 9B, the external resonator is composed of an end surface of the mode-locked semiconductor laser element 110 on which a high-reflection coating layer (HR) is formed and the external mirror 113, and a light beam is extracted from the external mirror 113.

Figure 10A:
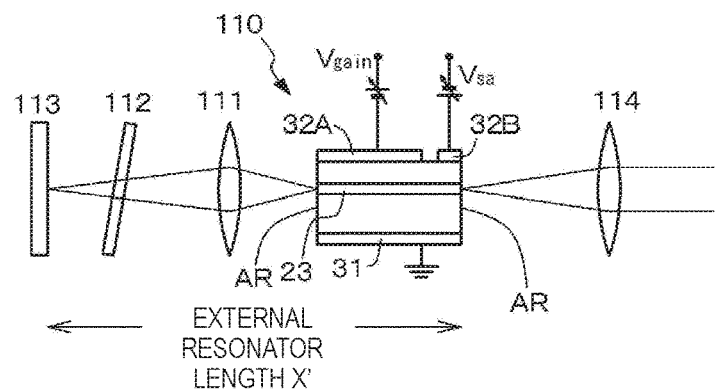
FIGS. 10A, 10B, and 10C are conceptual diagrams of laser device assemblies in Example 5.
Figure 10B:
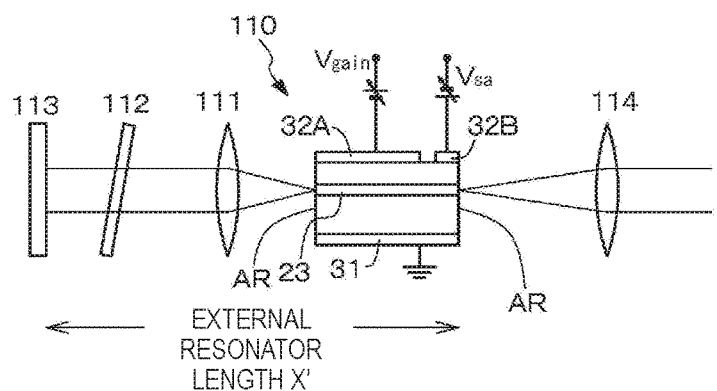
Figure 10C:
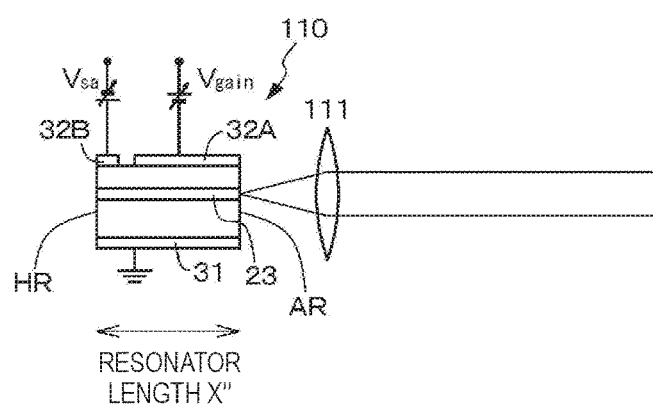

In external resonators illustrated in FIGS. 10A and 10B, the external resonator is composed of the second end surface 25 of the mode-locked semiconductor laser element 110 and an external mirror, and a light beam is extracted from the mode-locked semiconductor laser element 110. A low-reflection coating layer (AR) is formed on the second end surface 25. The example illustrated in FIG. 10A is of a light condensing type, and the example illustrated in FIG. 10B is of a collimating type. Alternatively, as illustrated in FIG. 10C, the semiconductor laser element may be configured as a monolithic type.

Needless to say, the optical semiconductor element (mode-locked semiconductor laser element) 110 of Example 5 can be used as the laser light source 100 in the laser device assembly described in Examples 1 to 4.

Hereinabove, the present disclosure is described based on preferred Examples, but the present disclosure is not limited to these Examples. The configuration of the optical semiconductor element, the laser device assembly, the semiconductor optical amplifier, the semiconductor laser element, and the laser light source and the configuration of the structure described in Examples are only examples, and may be altered as appropriate. Although various values are illustrated in Examples, also these are only examples and may be changed when, for example, the specifications of the optical semiconductor element used are changed, as a matter of course.

A configuration is possible in which the width of the second electrode is smaller than the width of the ridge stripe structure. In this case, stable transverse-mode amplified light can be obtained, and laser light emitted from the optical semiconductor element, such as the semiconductor optical amplifier, is unlikely to become unstable. The value of (the width of the second electrode)/(the width of the ridge stripe structure) may be 0.2 to 0.9, preferably 0.6 to 0.9. Here, the width of the second electrode and the width of the ridge stripe structure mean the width of the second electrode and the width of the ridge stripe structure obtained when the optical semiconductor element is cut along the XY plane.

Figure 11:
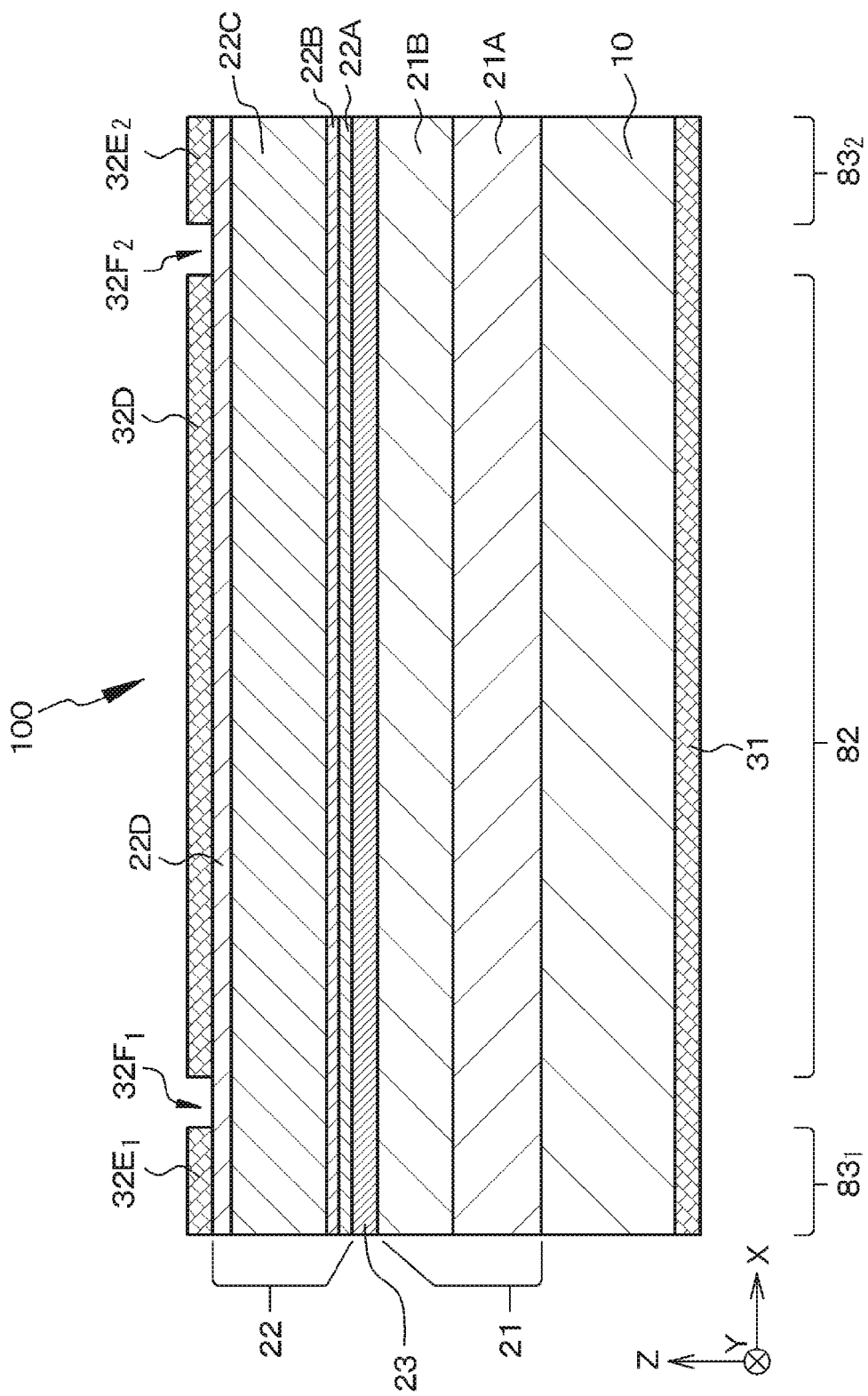
FIG. 11 is a schematic cross-sectional view along the XZ plane of a modification example of a mode-locked semiconductor laser element that forms a laser light source of a laser device assembly.
Figure 12:
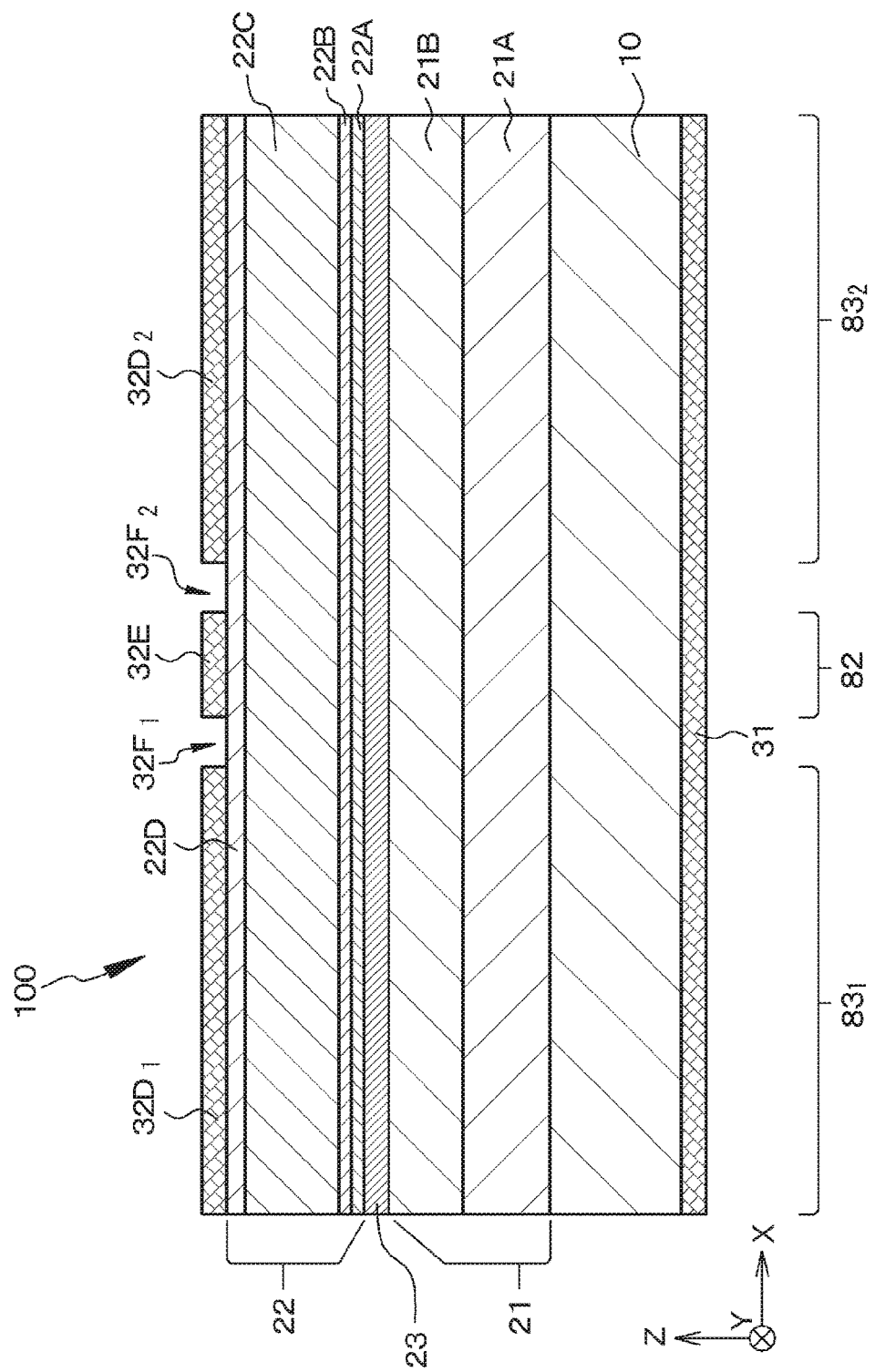
FIG. 12 is a schematic cross-sectional view along the XZ plane of another modification example of a mode-locked semiconductor laser element that forms a laser light source of a laser device assembly.

In the mode-locked semiconductor laser element 110 that forms the laser light source 100, the numbers of light emitting regions 82 and saturable absorption regions 83 are not limited to one. A schematic end view of a mode-locked semiconductor laser element in which one first region 32D of the second electrode and two second regions $32E_1$ and $32E_2$ of the second electrode are provided is shown in FIG. 11. In this mode-locked semiconductor laser element, one end of the first region 32D of the second electrode faces the one second region $32E_1$ of the second electrode across one isolation trench $32F_1$, and the other end of the first region 32D of the second electrode faces the other second region $32E_2$ of the second electrode across another isolation trench $32F_2$. One light emitting region 82 is sandwiched by two saturable absorption regions $83_1$ and $83_2$. Alternatively, a schematic end view of a mode-locked semiconductor laser element in which two first regions $32D_1$ and $32D_2$ of the second electrode and one second region 32E of the second electrode are provided is shown in FIG. 12. In this mode-locked semiconductor laser element, an end of the second region 32E of the second electrode faces the one first region 32D$_1$ of the second electrode across one isolation trench 32F$_1$, and the other end of the second region 32E of the second electrode faces the other first region 32D$_2$ of the second electrode across another isolation trench 32F$_2$. One saturable absorption region 83 is sandwiched by two light emitting regions 82$_1$ and 82$_2$.

In Examples, the optical semiconductor element is provided on the c-plane, the (0001) plane, which is the polar plane of the n-type GaN substrate, but alternatively, the optical semiconductor element may be provided on a non-polar plane such as the a-plane, which is the (11-20) plane, the m-plane, which is the (1-100) plane, or the (1-102) plane, or on a semi-polar plane such as a (11-2n) plane including the (11-24) plane and the (11-22) plane, the (10-11) plane, or the (10-12) plane. Thereby, even if piezoelectric polarization and spontaneous polarization have occurred in the third compound semiconductor layer (active layer) of the optical semiconductor element, piezoelectric polarization does not occur in the thickness direction of the third compound semiconductor layer, and piezoelectric polarization occurs in a direction substantially orthogonal to the thickness direction of the third compound semiconductor layer; thus, the adverse effects due to piezoelectric polarization and spontaneous polarization can be eliminated. The (11-2n) plane refers to a non-polar plane that makes an angle of approximately 40 degrees with the c-plane.

Additionally, the present technology may also be configured as below.

[A01] <<Optical Semiconductor Element>>

An optical semiconductor element including:

a stacked structure body formed of a first compound semiconductor layer, a third compound semiconductor layer, and a second compound semiconductor layer, wherein a fundamental mode waveguide region with a waveguide width W$_1$, a free propagation region with a width larger than W$_1$, and a light emitting region having a tapered shape with a width increasing toward a light emitting end surface are arranged in sequence.

[A02]

The optical semiconductor element according to [A01], wherein when a length of the free propagation region is denoted by L$_2$, a diffraction angle of light that proceeds from the fundamental mode waveguide region toward the free propagation region is denoted by θ$_1$, and a width of a boundary portion between the light emitting region and the free propagation region is denoted by W$_2$, $$W_2 > 2L_2 \cdot \tan(\theta_1) + W_1$$

is satisfied.

[A03]

The optical semiconductor element according to [A01] or [A02], wherein a value of M$^2$ of light emitted from the light emitting region is 3 or less.

[A04]

The optical semiconductor element according to any one of [A01] to [A03], wherein a first portion of a second electrode is formed on the second compound semiconductor layer in a first region of the stacked structure body that forms the fundamental mode waveguide region, a second portion of the second electrode is formed on the second compound semiconductor layer in a second region of the stacked structure body that forms the free propagation region, a third portion of the second electrode is formed on the second compound semiconductor layer in a third region of the stacked structure body that forms the light emitting region, and a first electrode electrically connected to the first compound semiconductor layer that forms the stacked structure body is provided.

[A05]

The optical semiconductor element according to [A04], wherein the first portion of the second electrode is continuous with the second portion of the second electrode, the second portion of the second electrode is separated from the third portion of the second electrode, a DC voltage is applied between the first portion of the second electrode and the second portion of the second electrode, and the first electrode, and a pulsed voltage is applied between the third portion of the second electrode and the first electrode.

[A06]

The optical semiconductor element according to [A05], wherein a current of 3×10$^3$ amperes or more per 1 cm$^2$ of the third portion of the second electrode is sent to the third portion of the second electrode.

[A07]

The optical semiconductor element according to [A04], wherein the first portion of the second electrode, the second portion of the second electrode, and the third portion of the second electrode are continuous with each other, and a DC voltage is applied between the first portion of the second electrode, the second portion of the second electrode, and the third portion of the second electrode, and the first electrode.

[A08]

The optical semiconductor element according to any one of [A01] to [A07], wherein the first region of the stacked structure body that forms the fundamental mode waveguide region, the second region of the stacked structure body that forms the free propagation region, and the third region of the stacked structure body that forms the light emitting region have a ridge stripe structure.

[A09]

The optical semiconductor element according to any one of [A01] to [A07], wherein only the first region of the stacked structure body that forms the fundamental mode waveguide region has a ridge stripe structure.

[A10]

The optical semiconductor element according to any one of [A01] to [A09], wherein a current non-injection region is provided near the light emitting end surface.

[A11]

The optical semiconductor element according to any one of [A01] to [A10], wherein the stacked structure body is made of a GaN-based compound semiconductor.

[A12]

The optical semiconductor element according to any one of [A01] to [A11], wherein when an average width of the free propagation region is denoted by W$_{2\text{-}ave}$ and a width of a portion of the light emitting region that faces the light emitting end surface is denoted by W$_3$, $$0.5 \text{ μm} \leq W_1 \leq 2.5 \text{ μm}$$

$$1.2 \leq W_{2\text{-}ave}/W_1 \leq 500$$

$$20 \text{ μm} \leq W_3 \leq 650 \text{ μm}$$

are satisfied.

[A13]

The optical semiconductor element according to any one of [A01] to [A12], wherein an axis of the light emitting region and the light emitting end surface cross each other at an acute angle.

[A14]

The optical semiconductor element according to any one of [A01] to [A13], wherein the optical semiconductor element is formed of a semiconductor optical amplifier.

[A15]

The optical semiconductor element according to any one of [A01] to [A13], wherein the optical semiconductor element is formed of a semiconductor laser element.

[A16]

The optical semiconductor element according to any one of [A04] to [A13], wherein a semiconductor laser element is formed of a mode-locked semiconductor laser element.

[A17]

The optical semiconductor element according to [A16], wherein a saturable absorption region formed of the stacked structure body is provided between the fundamental mode waveguide region and a first end surface, a second region of the second electrode is provided on a portion of the second compound semiconductor layer of the stacked structure body that forms the saturable absorption region, and the second region of the second electrode is separated from the first portion of the second electrode.

[B01] <<Laser Device Assembly>>

A laser device assembly including:

a laser light source; and a semiconductor optical amplifier that is formed of the optical semiconductor element according to any one of [A01] to [A12] and configured to amplify laser light emitted from the laser light source, wherein an axis of the light emitting region and the light emitting end surface in the optical semiconductor element forming the semiconductor optical amplifier cross each other at an acute angle.

[B02]

The laser device assembly according to [B01], wherein a width of a portion of the fundamental mode waveguide region where laser light from the laser light source enters is equal to a width of the laser light that enters.

[B03]

The laser device assembly according to [B01] or [B02], wherein the laser light source is formed of a semiconductor laser element.

[B04]

The laser device assembly according to any one of [B01] to [B03], wherein a semiconductor laser element is formed of a mode-locked semiconductor laser element.

REFERENCE SIGNS LIST 10 substratum
20 stacked structure body
$20_1$ first region of stacked structure body that forms fundamental mode waveguide region
$20_2$ second region of stacked structure body that forms free propagation region
$20_3$ third region of stacked structure body that forms light emitting region
20A, 20B ridge stripe structure
21 first compound semiconductor layer
21A first cladding layer
21B first light guide layer
22 second compound semiconductor layer
22A p-type electron barrier layer
22B second light guide layer
22C second cladding layer
22D p-type contact layer
23 third compound semiconductor layer (active layer)
24 first end surface
25 light emitting end surface (second end surface)
26 stacked insulating film
31 first electrode
32, 32A, 32D, $32D_1$, $32D_2$ second electrode (first region of the second electrode)
$32_1$ first portion of the second electrode
$32_2$ second portion of the second electrode
$32_3$ third portion of the second electrode
32B, 32E, $32E_1$, $32E_2$ second region of the second electrode
32C, $32F_1$, $32F_2$ isolation trench
40 fundamental mode waveguide region
50 free propagation region
60 light emitting region
70 current non-injection region
80, 82 light emitting region (gain region)
81, 83 saturable absorption region
100 laser light source
110 mode-locked semiconductor laser element
111, 114 lens
112 optical filter
113 external mirror
120 optical isolator
121, 122 reflection mirror
123 half-wave plate (λ/2 wave plate)
124, 125 lens
200 optical semiconductor element (semiconductor optical amplifier)
AR low-reflection coating layer or anti-reflection coating layer
HR high-reflection coating layer

The invention claimed is:

1. An optical semiconductor element, comprising:
a stacked structure body that comprises a first compound semiconductor layer, a second compound semiconductor layer, and a third compound semiconductor layer;
a fundamental mode waveguide region with a waveguide width $W_1$;
a free propagation region with a width larger than $W_1$; and
a light emitting region that has a tapered shape with a width that increases toward a light emitting end surface of the optical semiconductor element, wherein the fundamental mode waveguide region, the free propagation region, and the light emitting region are arranged in sequence, and
wherein $W_2 > 2L_2 \cdot \tan(\theta_1) + W_1$ is satisfied,
where $L_2$ is a length of the free propagation region, $\theta_1$ is a diffraction angle of light that proceeds from the fundamental mode waveguide region toward the free propagation region, and $W_2$ is a width of a boundary portion, of the optical semiconductor element, between the light emitting region and the free propagation region.

2. The optical semiconductor element according to claim 1, wherein a value of a beam propagation factor of light emitted from the light emitting region is 3 or less.

3. The optical semiconductor element according to claim 1, further comprising:

a first electrode electrically connected to the first compound semiconductor layer; and a second electrode, wherein a first portion of the second electrode is on the second compound semiconductor layer in a first region of the stacked structure body, wherein the first region constitutes the fundamental mode waveguide region, wherein a second portion of the second electrode on the second compound semiconductor layer in a second region of the stacked structure body, wherein the second region constitutes the free propagation region, and wherein a third portion of the second electrode on the second compound semiconductor layer in a third region of the stacked structure body, wherein the third region constitutes the light emitting region.

4. The optical semiconductor element according to claim 3, wherein the first portion of the second electrode is continuous with the second portion of the second electrode, the second portion of the second electrode is separated from the third portion of the second electrode, a DC voltage is to be applied between the first portion of the second electrode and the second portion of the second electrode, and the first electrode, and a pulsed voltage is to be applied between the third portion of the second electrode and the first electrode.

5. The optical semiconductor element according to claim 4, wherein a current of $3 \times 10^3$ amperes or more per 1 cm$^2$ of the third portion of the second electrode is to be transferred to the third portion of the second electrode.

6. The optical semiconductor element according to claim 3, wherein the first portion of the second electrode, the second portion of the second electrode, and the third portion of the second electrode are continuous with each other, and a DC voltage is to be applied between the first portion of the second electrode, the second portion of the second electrode, the third portion of the second electrode, and the first electrode.

7. The optical semiconductor element according to claim 3, wherein the first region, the second region, and the third region have a ridge stripe structure.

8. The optical semiconductor element according to claim 3, wherein only the first region has a ridge stripe structure.

9. The optical semiconductor element according to claim 1, wherein a current non-injection region of the stacked structure body is in a vicinity of the light emitting end surface.

10. The optical semiconductor element according to claim 1, wherein the stacked structure body comprises a GaN-based compound semiconductor.

11. The optical semiconductor element according to claim 1, wherein $0.5 \ \mu m \leq W_1 \leq 2.5 \ \mu m$, $1.2 \leq W_{2-ave}/W_1 \leq 500$, and $20 \ \mu m \leq W_3 \leq 650 \ \mu m$ are satisfied, where $W_{2-ave}$ is an average width of the free propagation region and $W_3$ is a width of a portion of the light emitting region that faces the light emitting end surface.

12. The optical semiconductor element according to claim 1, wherein an axis of the light emitting region and the light emitting end surface cross each other at an acute angle.

13. The optical semiconductor element according to claim 1, wherein the optical semiconductor element is a semiconductor optical amplifier.

14. The optical semiconductor element according to claim 1, wherein the optical semiconductor element is a semiconductor laser element.

15. A laser device assembly, comprising:
a laser light source configured to emit laser light; and
a semiconductor optical amplifier configured to amplify the laser light emitted from the laser light source, wherein the semiconductor optical amplifier comprises:
a stacked structure body that comprises a first compound semiconductor layer, a second compound semiconductor layer, and a third compound semiconductor layer;
a fundamental mode waveguide region with a waveguide width $W_1$;
a free propagation region with a width larger than $W_1$; and
a light emitting region that has a tapered shape with a width that increases toward a light emitting end surface of the semiconductor optical amplifier, wherein the fundamental mode waveguide region, the free propagation region, and the light emitting region are arranged in sequence,
wherein $W_2 > 2L_2 \cdot \tan(\theta_1) + W_1$ is satisfied,
where $L_2$ is a length of the free propagation region, $\theta_1$ is a diffraction angle of light that proceeds from the fundamental mode waveguide region toward the free propagation region, and $W_2$ is a width of a boundary portion, of the optical semiconductor element, between the light emitting region and the free propagation region, and
wherein an axis of the light emitting region and the light emitting end surface of the semiconductor optical amplifier cross each other at an acute angle.

16. The laser device assembly according to claim 15, wherein a width of a portion of the fundamental mode waveguide region where the laser light from the laser light source enters is equal to a width of the laser light that enters the portion of the fundamental mode waveguide region.

17. The laser device assembly according to claim 15, wherein the laser light source is a semiconductor laser element.

* * * * *